United States Patent
Choo et al.

(10) Patent No.: US 8,797,063 B2
(45) Date of Patent: Aug. 5, 2014

(54) DATA TRANSMISSION DEVICE AND IMAGE SENSOR SYSTEM USING THE SAME

(75) Inventors: Kyo-Jin Choo, Seoul (KR); Yu-Jin Park, Seoul (KR); Yong Lim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 297 days.

(21) Appl. No.: 13/180,064

(22) Filed: Jul. 11, 2011

(65) Prior Publication Data

US 2012/0007653 A1    Jan. 12, 2012

(30) Foreign Application Priority Data

Jul. 12, 2010  (KR) .................. 10-2010-0066714

(51) Int. Cl.
*H03K 19/0175* (2006.01)

(52) U.S. Cl.
USPC ................ 326/82; 326/40; 327/400

(58) Field of Classification Search
USPC ............................ 327/400; 326/82
See application file for complete search history.

(56) References Cited

U.S. PATENT DOCUMENTS

| 5,635,851 A | * | 6/1997 | Tavana ........................... 326/27 |
| 5,677,638 A | * | 10/1997 | Young et al. ..................... 326/39 |
| 5,847,580 A | * | 12/1998 | Bapat et al. ..................... 326/82 |
| 6,154,052 A | * | 11/2000 | New ................................. 326/41 |

FOREIGN PATENT DOCUMENTS

| KR | 100496785 | 6/2005 |
| KR | 1020080029367 | 4/2008 |
| KR | 1020100001831 | 1/2010 |

OTHER PUBLICATIONS

Chinese Patent Application No. 200710007942.2—Rejection Decision.

* cited by examiner

*Primary Examiner* — Ryan Jager
(74) *Attorney, Agent, or Firm* — F. Chau & Associates, LLC

(57) ABSTRACT

A data transmission device includes a control unit and a delay chain unit. The control unit outputs a first control signal through an nth control signal, where n is a natural number. The delay chain unit includes a first switching element through an nth switching element. The switching elements receive a first data signal through an nth data signal and perform pipelining operations on the first through nth data signals based upon the first through nth control signals, respectively, to output the pipelined data signals as at least one data stream. The switching elements are connected to each other to form at least one data delay chain.

11 Claims, 19 Drawing Sheets

120a

120b

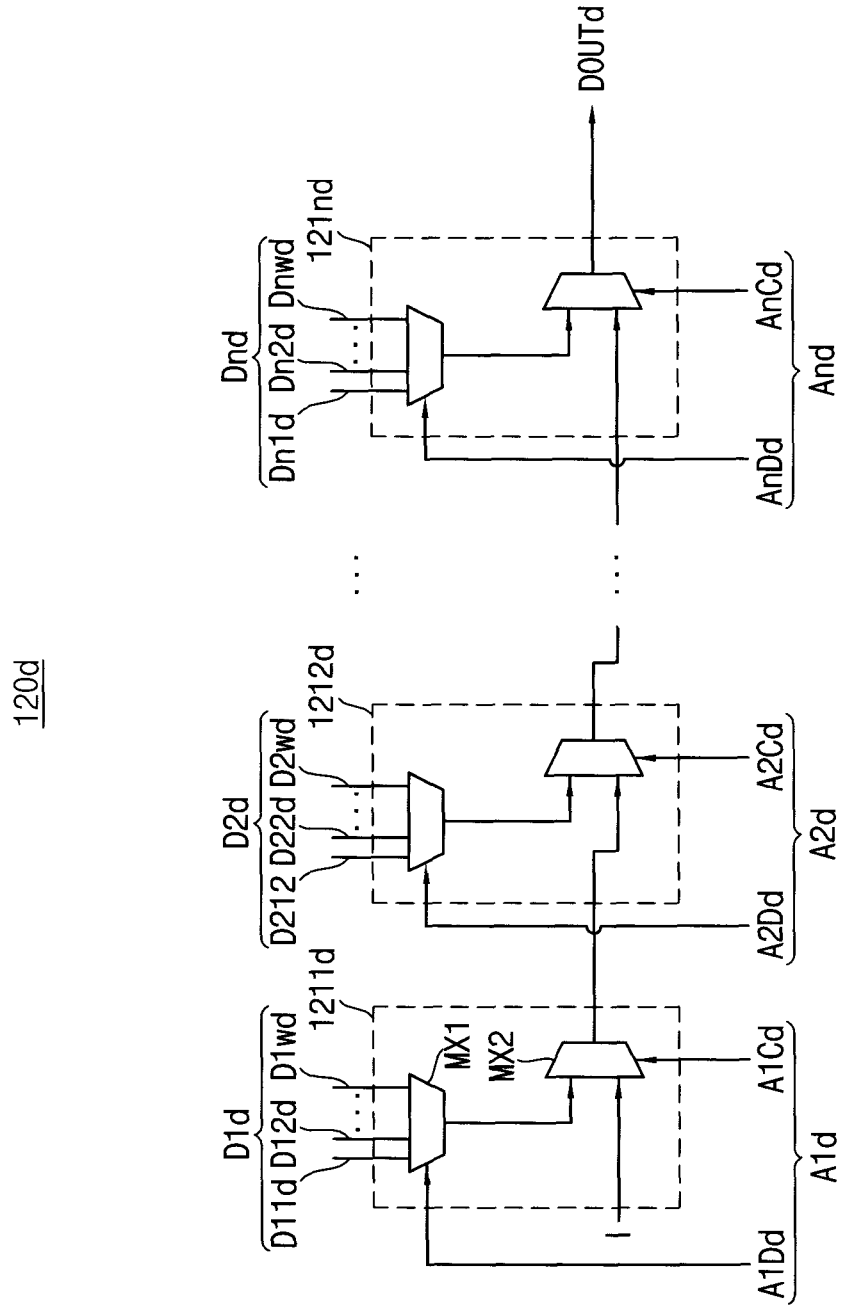

100c

135c

DATA TRANSMISSION DEVICE AND IMAGE SENSOR SYSTEM USING THE SAME

CROSS-REFERENCE TO RELATED APPLICATION

This application claims under 35 USC §119 priority to and the benefit of Korean Patent Application No. 10-2010-0066714, filed on Jul. 12, 2010, in the Korean Intellectual Property Office (KIPO), the entire content of which is incorporated by reference herein.

BACKGROUND

1. Technical Field

The present disclosure relates to data transmission, and, more particularly, to data transmission devices and image sensor systems using the data transmission devices.

2. Discussion of the Related Art

Typically, an electronic device employs a data bus to establish a communication configuration among the components in the electronic device. Increasing the transmission capacity and operating speed of the electronic device leads to demands for reducing the power consumption during the internal data transmission.

Conventional data transmission methods can be categorized into, for example, single-ended signaling methods and differential signaling methods. The differential signaling methods are widely used for high speed transmission because the methods can reduce the common mode signals and perform data transmission using signals having a small voltage swing. Typically, the differential signaling methods require transmitters, such as current mode drivers, and receivers, such as sense amplifiers, that have relatively high power consumption.

In recent years, the increasing demand for high resolution in multimedia data (e.g., image data) has led to the development of various types of CMOS devices (e.g., image sensor devices) capable of transmitting image data at high speeds. In a conventional configuration adopting low-voltage signaling methods such as the differential signaling methods, transmitters are controlled to output the respective column data signals during the predetermined time periods so that a large amount of column data signals is transmitted using a single pair of transmission lines. That is, during each of the predetermined time periods, only one of the column signals may be transmitted through the single transmission line. In general, the performance of signal transmission depends on various factors such as resistance, parasitic capacitance of transmission wires, etc. When long wires having relatively high resistance are employed by CMOS circuits to transmit data signals, transmission delays may be significantly affected by the resistance and the capacitance of the long wires.

SUMMARY

In accordance with exemplary embodiments of the present inventive concept data transmission devices capable of reducing data transmission delay are provided.

In accordance with exemplary embodiments of the present invention image sensor systems including the data transmission devices are provided.

In accordance with an exemplary embodiment a data transmission device includes a control unit configured to output a first control signal through an nth control signal, where n is a natural number, and a delay chain unit including a first switching element through an nth switching element that receive a first data signal through an nth data signal, respectively, and that perform pipelining operations on the first data signal through nth data signal based upon the first control signal through nth control signal, respectively, to output pipelined data signals as at least one data stream, the first switching element through nth switching element being connected to each other to form at least one data delay chain.

The switching elements may be uniformly arranged to have a predetermined distance between every two adjacent switching elements.

The control unit may sequentially activate the control signals so that the data signals are sequentially outputted as the at least one data stream in response to the sequentially activated control signals.

An interval between activation timings of two control signals corresponding to two adjacent switching elements may be longer than a propagation delay of each switching element.

Each of the switching elements may include a first multiplexer configured to perform a first multiplexing operation on a corresponding data signal to output a multiplexed data signal, and a second multiplexer configured to perform a second multiplexing operation on the multiplexed data signal and an output signal of a previous switching element connected to the switching element.

Each of the data signals may include a plurality of sub-data signals, and each of the switching elements may selectively output one of sub-data signals in response to a corresponding control signal of the control signals.

The control unit may include a control signal generating block configured to generate a first switching activation signal through an nth switching activation signal, and a control signal delaying block configured to delay the switching activation signals to output the delayed switching activation signals as the control signals.

The control signal delaying block may include a first delay element through an nth delay element having substantially the same propagation delays with the first switching element through the nth switching element, respectively.

The control unit may include a control signal generating block configured to generate the first control signal to the nth control signal, and a control signal delay chain configured to generate a data enable signal including information on transmission timings of the data signals.

The data enable signal may include a data clock signal including information on transition timings of the respective data signals and a transmission enable signal including information on a transmission-start timing of the data signals.

The control signal delay chain may include a first delay element through an nth delay element having substantially the same propagation delays with the first switching element through the nth switching element, respectively.

The switching elements may be connected in series to each other to form a single data delay chain, and the nth switching element may output the pipelined data signals as a single data stream through the single data delay chain.

The first switching element may perform a logical operation on the first data signal and the first control signal to output an operated signal to the second switching element.

In accordance with an exemplary embodiment an image sensor system includes a timing controller configured to output a sensor control signal and a first control signal through an nth control signal, where n is a natural number, an image sensing unit configured to generate an image signal based upon the sensor control signal, a signal processing unit configured to generate a first data signal to an nth data signal based upon the image signal, and a delay chain unit including a first switching element through an nth switching element that receive the first through nth data signals and perform pipelining operations on the first through nth data signals based upon the first control signal through nth control signal, respectively, to output the pipelined data signals as at least one data stream, the first switching element through nth switching element being connected to each other to form at least one data delay chain.

The signal processing unit may convert the image signal to the data signals without using a current mode driver.

The delay chain unit may output the pipelined data signals without performing amplifying operation on the pipelined signals.

In accordance with an exemplary embodiment a delay chain in a signal processing system for controllably adjusting signal delay of a data signal received from a signal processor is provided. The delay chain includes a plurality of switching elements connected in series and configured to form a transmission path for the data signal from the signal processor to an output terminal, each switching element configured to receive a portion of the data signal in parallel, each switching element configured to perform a pipelining switching operation on the respective portions of the data signal in response to a respective control signal applied to each switching element, each switching element being spaced apart from an adjacent switching element by a transmission line segment having a predetermined distance. Each of the respective control signals are applied to control signal delay between the signal processor and the output terminal based upon propagation delays of each of the switching elements, resistance and capacitance of each transmission line segment, and the predetermined distance of each transmission line segment.

The data signal may be one of a pair of complementary signals transmitted over separate transmission lines for differential signal processing by a receiver.

Each portion of the data signal may represent one bit of a multi-bit signal.

The multi-bit signal may correspond to a least one pixel value of an image or audio.

BRIEF DESCRIPTION OF THE DRAWINGS

Illustrative, non-limiting exemplary embodiments will be more clearly understood from the following detailed description taken in conjunction with the accompanying drawings.

FIGS. 2A, 2B, 2C, 2D, 2E and 2F are circuit diagrams illustrating exemplary embodiments of the delay chain unit in the data transmission device of FIG. 1.

DETAILED DESCRIPTION

Figure 1:
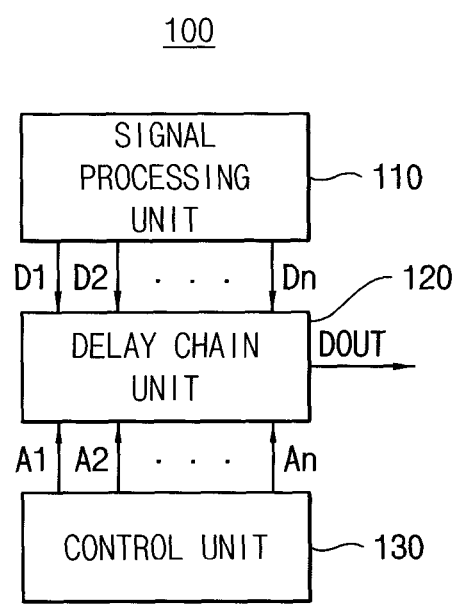
FIG. 1 is a diagram illustrating a data transmission device according to an exemplary embodiment.

Various exemplary embodiments will be described more fully hereinafter with reference to the accompanying drawings, in which exemplary embodiments are shown. The present inventive concept may, however, be embodied in many different forms and should not be construed as limited to the exemplary embodiments set forth herein. In the drawings, the layout and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 is a diagram illustrating a data transmission device according to an exemplary embodiment.

Referring to FIG. 1, a data transmission device 100 includes a delay chain unit 120 and a control unit 130, which are configured to perform data transmission by delaying signals from a signal processing unit 110.

The signal processing unit 110 outputs a first data signal D1 through an nth data signal Dn (n being a natural number). The data signals D1, D2, . . . , Dn may represent multimedia data generated by multimedia capturing devices. For example, video cameras, including webcams which feed its images in real time to a signal processing unit such as a computer or computer network, can capture both audio and video. The audio and video can then be processed, changed in format as needed, and output as processed data signals. Data signals D1, D2, . . . , Dn may represent at least one pixel value of an image or audio. The data signals D1, D2, . . . , Dn may be one-bit signals each of which indicate one bit of multi-bit data signals. For convenience of explanation, in the exemplary embodiments disclosed herein the data signals D1, D2, . . . , Dn have a digital form, but the data signals D1, D2, ..., Dn may have both of an analog form and the digital form.

The data signals D1, D2, ..., Dn may be transmitted to the delay chain unit 120 through respective transmission lines, as illustrated in FIG. 1. The data signals D1, D2, ..., Dn may be time-varying signals such that values of the data signals D1, D2, ..., Dn have time-varying values representing the content of the multimedia data consecutively generated by the multimedia capturing devices. That is, the data signals D1, D2, ..., Dn may be varied according to a frame number or a block number indicating where the data signals are included as a portion of the multimedia data.

The delay chain unit 120 includes a first switching element to an nth switching element. The switching elements are connected to each other to form at least one data delay chain transmitting the at least one data stream DOUT. For convenience of illustration, FIG. 1 shows only the one data stream DOUT to be output through one transmission line, but the number of the transmission lines/data stream may be two or more. The switching elements receive the first data signal D1 through the nth data signal Dn, respectively.

The switching elements perform pipelining operations on the data signals D1, D2, ..., Dn based upon a first control signal A1 through an nth control signal An, respectively. In a pipeline operation a set of data processing elements are connected in series so that the output of one element is the input of the next one. The elements of the pipeline are often executed in parallel or in time-sliced fashion, much like in an automobile assembly line.

The delay chain unit 120 may output the pipelined data signals as the data stream DOUT in an order determined according to the control signals A1, A2, ..., An. The order may be determined by controlling respective activation timings of the control signals A1, A2, ..., An. In an exemplary embodiment, the delay chain unit 120 may output a plurality of data streams DOUT as illustrated in FIG. 2C.

The control unit 130 outputs the first control signal A1 through the nth control signal An. The control signals A1, A2, ..., An are signals for controlling the timings of outputting the data signals D1, D2, ..., Dn of the delay chain unit 120. The control signals A1, A2, ..., An may be activated to have delays longer than propagation delays of the switching elements. In other words, the interval between activation timings of two switching elements that are consecutively activated may be longer than the propagation delay of each switching element.

Figure 4A:
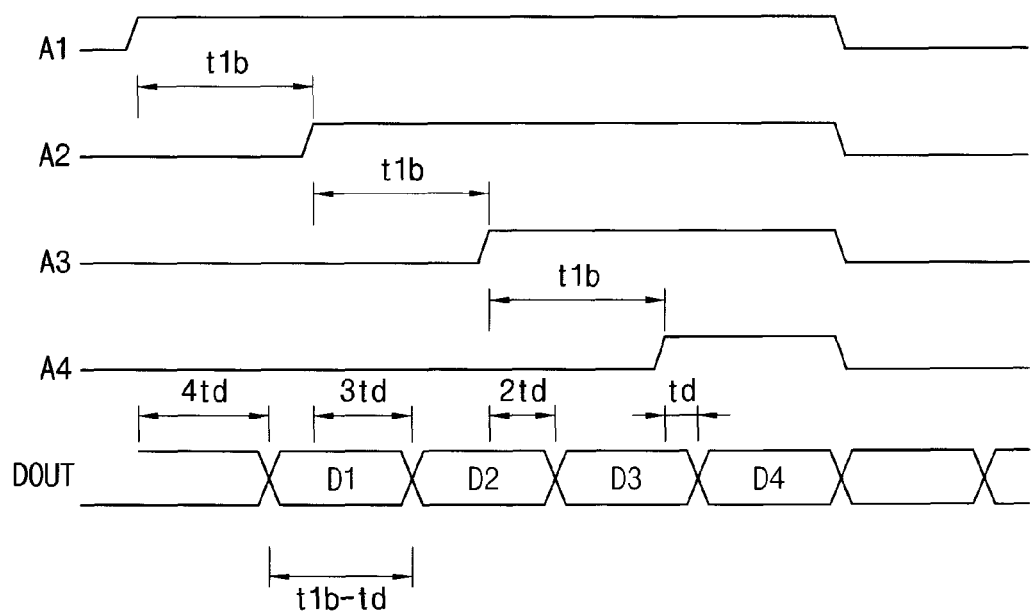
FIGS. 4A and 4B are a timing diagrams illustrating data transmission operation according to exemplary embodiments.
Figure 4B:
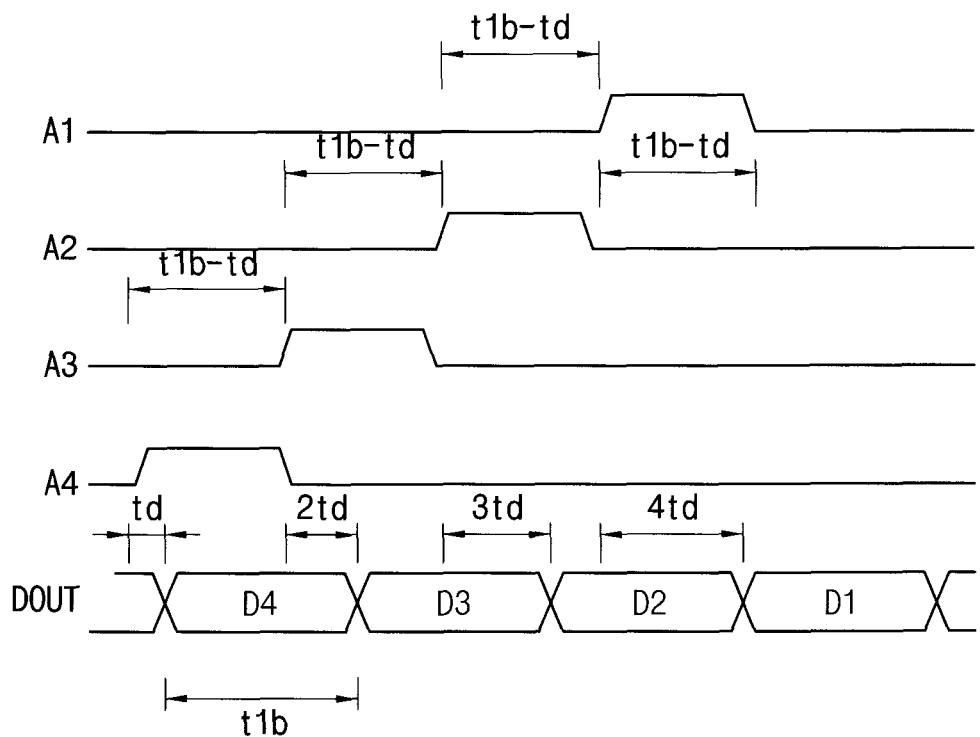

In an exemplary embodiment, the control unit 130 may generate the control signals A1, A2, ..., An that are sequentially activated from A1 to An as illustrated in FIG. 4A or from An to A1 as illustrated in FIG. 4B.

The control unit 130 may generate the control signal A1, A2, ..., An by activating or deactivating the control signals to have a logic high level (e.g., digital '1') corresponding to an activation level or to have a logic low level (e.g., digital '0') corresponding to a deactivation level. For example, the control unit 130 may activate the control signals A1, A2, ..., An in an order where respective output delays of the signals D1, D2, ..., Dn descend or ascend. The output delay of a data signal represents a time interval between an activation timing of the corresponding control signal and an output timing of the data signal from the delay chain unit 120.

The signal processing unit 110 may receive data from an external device and may convert the received data into multiple bit signals including the data signals D1, D2, ..., Dn. For example, the signal processing unit 110 may receive source data from a semiconductor memory cell array, a pixel array of an image sensor, a microprocessor unit, etc. and may convert the source data to output the converted data to the delay chain unit 120. For example, the source data is an analog data and the converted data is a digital data. In this case, the signal processing unit 110 may include an analog-to-digital converter to convert the received analog data to the digital data.

As will be described with reference to FIGS. 5, 8 and 10, the data transmission device 100 may further include a timing compensator such as a control signal delaying block and control signal delay chains. The timing compensator may adjust the activation timings of the control signals A1, A2, ..., An or may generate a data clock signal indicating output timings of the data signals D1, D2, ..., Dn. In general, signaling methods may be divided into single-ended signaling methods and differential signaling methods. In single-ended signaling, a transmitter generates a single voltage that a receiver compares with a fixed reference voltage, both relative to a common ground connection shared by both ends. In differential signal information is transmitted by means of two complementary signals on two separate transmission wires. The differential signaling technique can be used for both analog signaling and digital signaling. While single-ended signaling is more common, it lacks some of the benefits of differential signaling such as realizing high speed data transmission by eliminating the common ground connection and by adopting small-swing voltage signals. With differential signaling the receiving device reads the difference between the two signals. Since the receiver ignores the wires' voltages with respect to ground, small changes in ground potential between transmitter and receiver do not affect the receiver's ability to detect the signal. While low supply voltages can reduce noise immunity, differential signaling for a given supply voltage can give twice the noise immunity of a single-ended system.

Data transmission systems employing the differential signal methods generally require transmitters that convert logic values such as '0' and '1' into corresponding current or voltage levels and receivers that convert vice versa. In high speed data transmission, the transmitters may be current mode drivers converting the logic values to corresponding currents. For example, the current mode drivers are employed in a complementary metal oxide semiconductor (CMOS) circuit design to transmit small-swing signals. In this case, sense amplifiers may receive the transmitted small-swing signals to amplify them to full-swing signals. Accordingly, the increase of data transmission speed may lead to an increase of power consumption of the components such as the sense amplifiers.

The data transmission device 100 according to exemplary embodiments of the present inventive concept reduces the RC delays of transmission lines. The sum of the RC delays may be reduced by dividing the transmission line into a plurality of sections by arranging the switching elements of the delay chain unit 120 on the transmission line. Moreover, data transmission device 100 according to the exemplary embodiments may reduce power consumption by eliminating the sense amplifiers and the current mode drivers.

Figure 2A:
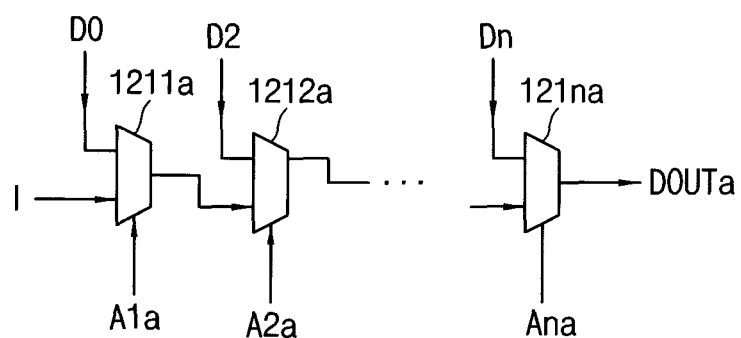
Figure 2B:
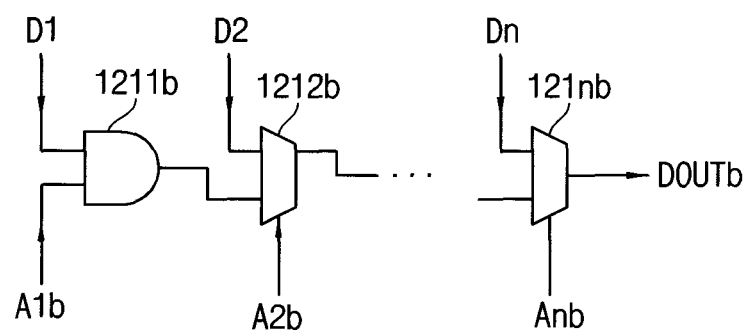
Figure 2C:
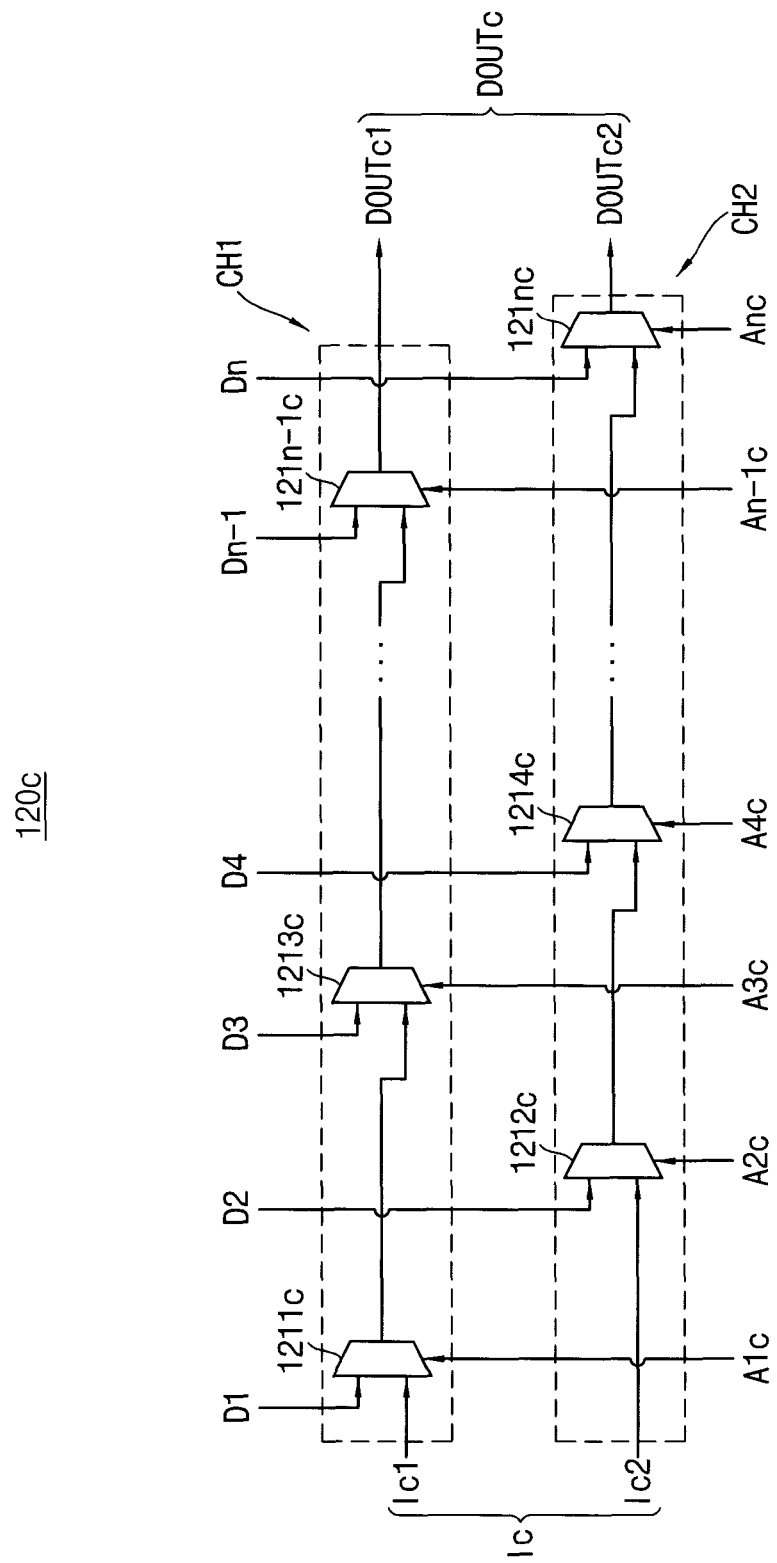
Figure 2E:
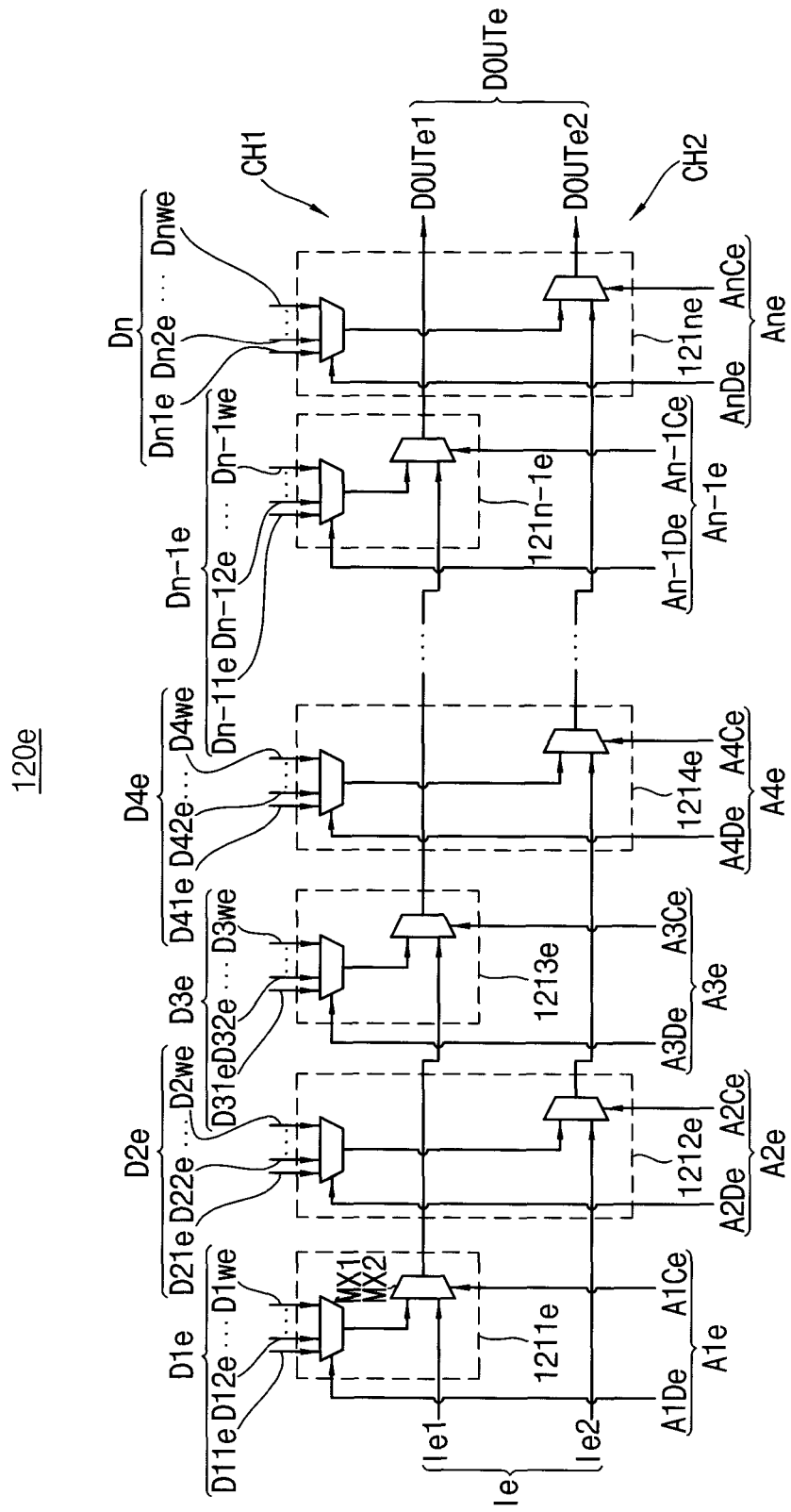
Figure 2F:
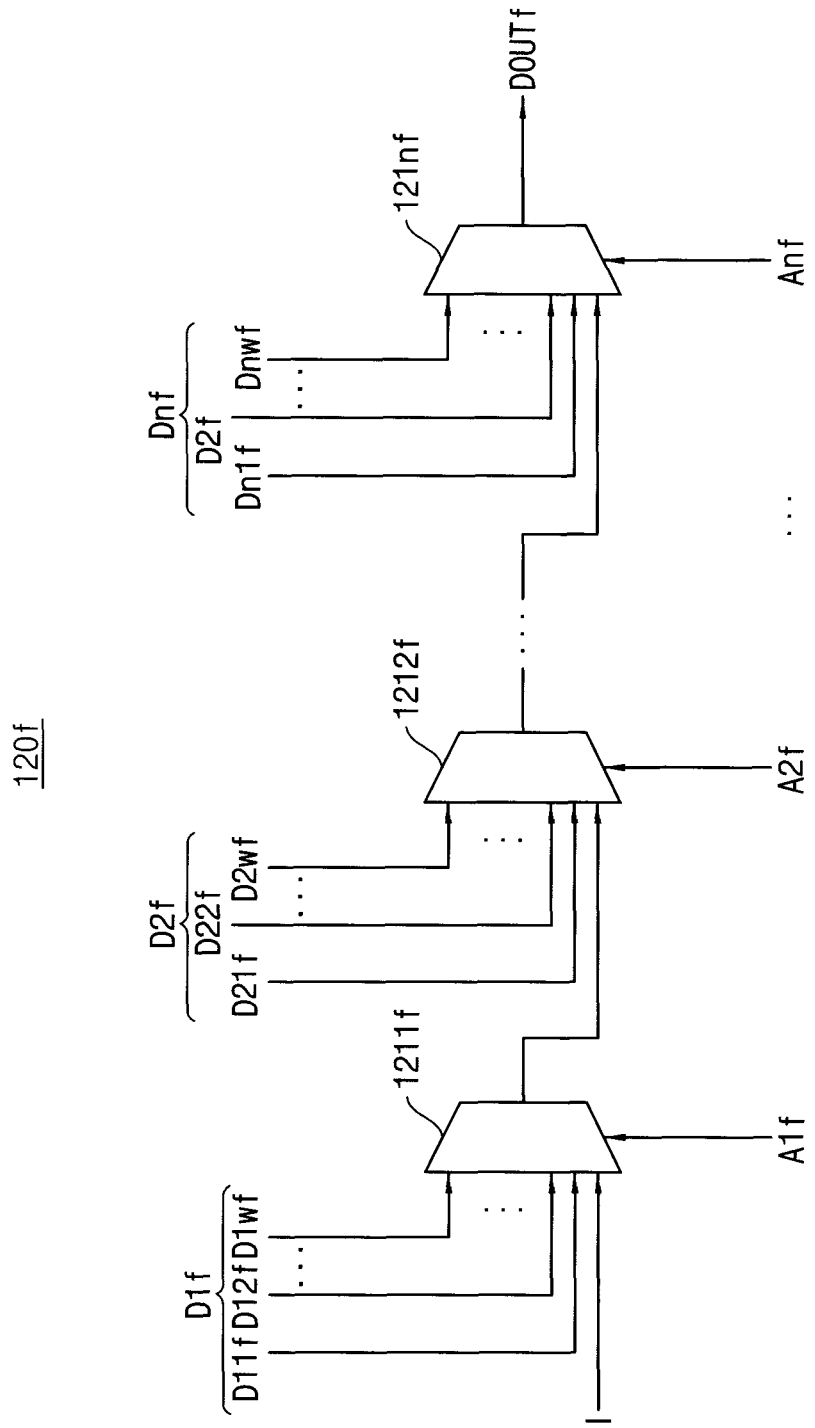

FIGS. 2A, 2B, 2C, 2D, 2E and 2F are circuit diagrams illustrating exemplary embodiments of delay chain unit in the data transmission device of FIG. 1. FIGS. 2A and 2B illustrate first and second exemplary embodiments of the delay chain 120 of FIG. 1 where the delay chain 120 outputs a single data stream based upon the data signals D1, D2, ..., Dn. FIG. 2C illustrates a third exemplary embodiment of the delay chain 120 of FIG. 1 where the delay chain 120 outputs a plurality of data streams (e.g., two data streams) based upon the data signals D1, D2, ..., Dn. Each of the data signals D1, D2, ..., Dn represents a one-bit data signal in FIGS. 2A, 2B and 2C. FIG. 2D illustrates a fourth exemplary embodiment of the delay chain 120 of FIG. 1 where the delay chain 120 outputs a single data stream and each of the data signals D1, D2, . . . , Dn represents a w-bit data signal (w being a natural number). FIG. 2E illustrates a fifth exemplary embodiment of the delay chain 120 of FIG. 1 where the delay chain 120 outputs two data streams and each of the data signals D1, D2, . . . , Dn represents a w-bit data signal. FIG. 2F illustrates a sixth exemplary embodiment of the delay chain 120 of FIG. 1 where the delay chain 120 outputs a single data stream and each of the data signals D1, D2, . . . , Dn represents a w-bit data signal.

Referring to FIG. 2A, the delay chain unit 120a may include the first switching element 1211a, the second switching element 1212a, . . . , the nth switching element 121na that are controlled to output a data stream signal DOUTa by performing pipelining operations on the data signals D1, D2, . . . , Dn based upon the control signals A1a, A2a, . . . , Ana. The switching elements 1211a, 1212a, . . . , 121na are connected in series to each other so that one data stream DOUTa may be output from the delay chain unit 120a. For example, the switching elements 1211a, 1212a, . . . , 121na are connected in an ascending order from the first switching element 1211a to the nth switching element 12na where the nth switching element 121na outputs the data stream DOUTa that corresponds to the result of the sequential pipelining operations performed on the data signals D1, D2, . . . , Dn.

The switching elements 1211a, 1212a, . . . , 121na may be a multiplexer outputting one selected between two input signals including a first input signal and a second input signal, based upon logical values of the control signals A1a, A2a, . . . , Ana, respectively. For example, the multiplexer may perform a pipelining operation on the first input signal and may output the other input signal selected from the two input signals based upon the corresponding control signal. In this case, the pipelining operation may be defined to delay the output timing of the first input signal until the other input signal is transferred. The two input signals may represent one of the data signals D1, D2, . . . , Dn and a signal received from a previous switching element. For example, the ith switching element 121i (i being a natural number larger than 1, and equal to or smaller than n) may receive the ith data signal Di and an output of the (i–1)th switching element 121(i–1).

The switching elements 1211a, 1212a, . . . , 121na may be uniformly arranged such that every two adjacent switching elements may have a predetermined distance. The predetermined distance may be determined based upon a required performance of the data transmission device 100 or a circuit configuration of the data processing unit 110 of FIG. 1 for transmitting the data signals D1, D2, . . . , Dn. The circuit configuration may be varied according to types of electronic devices employing the data transmission device 100 of FIG. 1. Moreover, the circuit configuration of the data processing unit 110 of FIG. 1 may be determined according to the arrangement of circuits that provide source data to the data processing unit 110. For example, the predetermined distance may correspond to an inter-pixel distance of a pixel array in the image sensor system.

The switching elements 1211a, 1212a, . . . , 121na may receive data signals D1, D2, . . . , Dn, respectively. Where the switching elements 1211a, 1212a, . . . , 121na are connected in the ascending order as illustrated in FIG. 2A, the first switching element 1211a may receive an initialization data I and the first data signal D1. In some exemplary embodiments, the initialization data I may be a status-representing signal or a bit data that is generated by an external device. In other exemplary embodiments, the initialization data I may be a data sequence to be transferred via the data transmission device 100. For example, the sequence of the initialization data I may be output as the data stream DOUTa when the control signals A1a, A2a, . . . , Ana are deactivated.

Although the switching elements 1211a, 1212a, . . . , 121na are connected in series to each other in the ascending order in FIG. 2A, the delay chain 120a may output the data signals D1, D2, . . . , Dn in any data transmission order determined based upon the control signals A1a, A2a, . . . , Ana. As will be described below with reference to FIG. 4B, the data transmission order may be determined to firstly output the data signal corresponding to the switching elements that is the most apart from the last switching element outputting the data stream DOUTa. Moreover, the delay chain unit 120a may output the data stream DOUTa representing the data signals D1, D2, . . . , Dn that are changed periodically. The delay chain unit 120a may output the data stream DOUTa in accordance with transmission timings predetermined based upon periodic activation or deactivation timings of the control signals A1a, A2a, . . . , Ana.

Referring to FIG. 2B, the delay chain unit 120b may include the first switching element 1211b, the second switching element 1212b, . . . , the nth switching element 121nb that are controlled to output a data stream DOUTb by performing pipelining operations on the data signals D1, D2, . . . , Dn based upon the respective control signals A1b, A2b, . . . , Anb. The switching elements 1211b, 1212b, . . . , 121nb are connected in an ascending order from 1211b to 12nb where the nth switching element 121nb outputs the data stream DOUTb that corresponds to the result of the sequential pipelining operations performed on the data signals D1, D2, . . . , Dn.

The switching elements 1212b, . . . , 121nb may be a multiplexer outputting one selected between two input signals, based upon logical values of the control signals A2b, . . . , Anb, respectively. For example, the ith switching element 121ib (i being a natural number larger than 2, and equal to or smaller than n) may receive the ith data signal Di and an output of the (i–1)th switching element 121(i–1)b.

Figure 3:
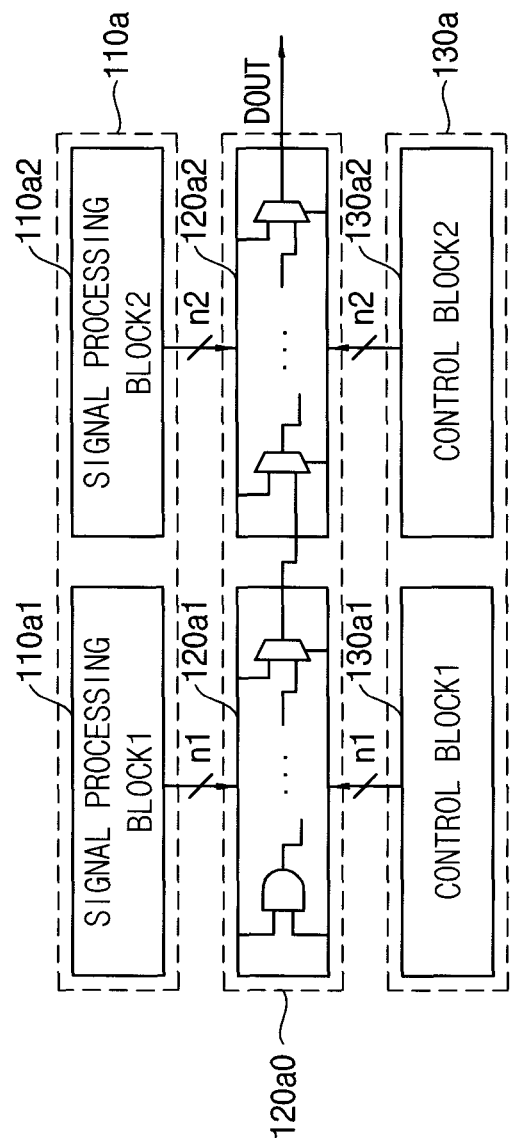
FIG. 3 is a block diagram illustrating an exemplary embodiment of the data transmission device of FIG. 1.

The switching elements 1211b, 1212b, . . . , 121nb may receive data signals D1, D2, . . . , Dn, respectively. Where the switching elements 1211b, 1212b, . . . , 121nb are connected in the ascending order as illustrated in FIG. 2B, the first switching element 1211b may be a logical conjunction gate (i.e., an AND gate) and may receive the first data signal D1 and the first control signal A1b as input signals. The first switching element 1211b may perform a logical conjunction operation (i.e., an AND operation) on the received first data signal D1 and the first control signal A1b. In a configuration of the ascending ordered connection as illustrated in FIG. 2B, the first switching element 1211b outputs the result of the AND operation to the second switching element 1212b. For example, the first switching element 1211b may output the first data signal D1 while the first control signal A1b remains at a logic high level (e.g., digital '1'). When the first control signal A1b has a logic low level (e.g., digital '0'), the first switching element 1211b may output the logic low level signal independently of the first data signal D1. As illustrated in FIG. 3, the configuration such as the delay chain unit 120b may be incorporated with that of the delay chain unit 120a as a front portion of a data transmission device. In this case, the data transmission device may transmit multiple-bit data received by the incorporated delay chain configuration, through a single transmission line.

For convenience of illustration, FIG. 2B shows that the first switching element 1211b is an AND gate, but the first switching element 1211b may be any type of logical operator such that the output signal thereof is determined merely based upon the first data signal D1 and the first control signal A1b without receiving an external signal as an input signal. The delay chain unit 120*b* of FIG. 2B is similar to the delay chain unit 120*a* of FIG. 2A, except that the first switching element 1211*b* is a logic gate, and thus a repeated description will be omitted.

Referring to FIG. 2C, the delay chain unit 120*c* may include the first switching element 1211*c*, the second switching element 1212*c*, . . . , the nth switching element 121*nc* that are controlled to output a first data stream DOUTc1 and a second data stream DOUTc2 by performing pipelining operations on the data signals D1, D2, D3, D4, . . . , Dn−1, Dn (n is an even number) based upon the respective control signals A1*c*, A2*c*, A3*c*, A4*c* . . . , An−1*c*, An*c*. The odd switching elements 1211*c*, 1213*c*, . . . , 121*n*−1*c* are connected in series to each other and the even switching elements 1212*c*, 1214*c*, . . . , 121*nc* are connected in series to each other, so that two data streams DOUTc1 and DOUTc2 are output from a first delay chain CH1 and a second delay chain CH2, respectively. For example, the odd switching elements 1211*c*, 1213*c*, . . . , 121*n*−1*c* are connected in an ascending order from 1211*c* to 12*n*−1*c* where the (n−1)th switching element 121*n*−1*c* outputs the first data stream DOUTc1 that corresponds to the result of the sequential pipelining operations performed on the odd data signals D1, D3, . . . , Dn−1. Similarly, the even switching elements 1212*c*, 1214*c*, . . . , 12*nc* are connected in an ascending order from 1212*c* to 12*nc* where the nth switching element 121*nc* outputs the second data stream DOUTc2 that corresponds to the result of the sequential pipelining operations performed on the odd data signals D2, D4, . . . , Dn.

The switching elements 1211*c*, 1212*c*, 1213*c*, 1214*c*, . . . , 121*n*−1*c*, 121*nc* may be a multiplexer outputting one selected between two input signals, based upon logical values of the control signals A1*c*, A2*c*, . . . , An*c*, respectively. For example, the multiplexer may perform the pipelining operation on the one input signal and may output the other input signal based upon the corresponding control signal. The two input signals may represent one of the data signals D1, D2, D3, D4 . . . , Dn−1, Dn and a signal received from a switching element. For example, the ith switching element 121*ic* (i being a natural number larger than 3, and equal to or smaller than n) may receive the ith data signal Di and an output of the (i−2)th switching element.

The switching elements 1211*c*, 1212*c*, 1213*c*, 1214*c*, . . . , 121*n*−1*c*, 121*nc* may receive data signals D1, D2, D3, D4 . . . , Dn−1, Dn, respectively. Where the odd switching elements 1211*c*, 1213*c*, . . . , 121*n*−1*c* are connected in the ascending order as illustrated in FIG. 2C, the first switching element 1211*c* may receive a first initialization data Ic1 as well as the first data signal D1. Where the even switching elements 1212*c*, 1214*c*, . . . , 12*nc* are connected in the ascending order as illustrated in FIG. 2C, the second switching element 1211*c* may receive a second initialization data Ic2 as well as the second data signal D2. In some exemplary embodiments, the first initialization data Ic1 and the second initialization data Ic2 may be status-representing signals or two-bit data that is generated by an external device and to be transferred via the data transmission device 100. In other exemplary embodiments, the initialization data Ic1 and Ic2 may corresponds to a sequence of two-bit data to be transferred via the data transmission device 100. In these cases, the sequence of initialization data Ic1 may be output as the first data stream DOUTc1 when the odd control signals A1*c*, A3*c*, . . . , An−1*c* are deactivated and the sequence of initialization data Ic2 may be output as the second data stream DOUTc2 when the even control signals A2*c*, A4*c*, . . . , An*c* are deactivated The delay chain unit 120*c* may include two delay chains CH1, CH2. The first delay chain CH1 may be formed using the odd switching elements 1211*c*, 1213*c*, . . . , 121*n*−1*c* and second chain CH2 may be formed using the even switching elements 1212*c*, 1214*c*, . . . , 12*nc*. The delay chains CH1, CH2 may be arranged in parallel. As described above, the delay chain unit 120*c* may output two data stream DOUTc1, DOUTc2 through respective delay chains CH1, CH2. The first delay chain CH1 may output the first data stream DOUTc1 representing the odd data signals D1, D3, . . . , Dn−1 that are pipelined based upon the odd control signals A1*c*, A3*c*, . . . , An−1*c*, respectively. Similarly, the second delay chain CH2 may output the second data stream DOUTc2 representing the even data signals D2, D4, . . . , Dn that are pipelined based upon the even control signals A2*c*, A4*c*, . . . , An*c*, respectively.

For convenience of illustration, FIG. 2C shows only two delay chains CH1, CH2 formed in the delay chain unit 120*c*. The delay chain unit may include a varied number of delay chains in the delay chain unit 120*c*. For convenience of illustration again, FIG. 2C shows that the data signals are divided into odd data signals D1, D3, . . . , Dn−1 and even data signals D2, D4, . . . , Dn and output through the respective delay chains CH1, CH2. The delay chains may be formed to output data signals selected from the data signals D1, D2, D3, D4, . . . , Dn−1, Dn.

The delay chain unit 120*c* of FIG. 2C is similar to the delay chain unit 120*a* of FIG. 2A except that the switching elements 1211*c*, 1212*c*, . . . , 121*nc* are connected to each other to form a two delay chains CH1, CH2 that outputs data streams DOUTc1, DOUTc2 respectively, and thus a repeated description will be omitted.

Referring to FIG. 2D, the delay chain unit 120*d* may include the first switching element 1211*d*, the second switching element 1212*d*, . . . , the nth switching element 121*nd* that are controlled to output a data stream DOUTd by performing pipelining operations on the data signals D1*d*, D2*d*, . . . , Dn*d* based upon the control signals A1*d*, A2*d*, . . . , An*d*. The switching elements 1211*d*, 1212*d*, . . . , 121*nd* are connected in series to each other so that one data stream DOUTd is output from the delay chain unit 120*d*. As illustrated in FIG. 2D, each of the data signals D1*d*, D2*d*, . . . , Dn*d* may include a plurality of sub-data signals. For example, the first data signal D1*d* may include the plurality of sub signals D11*d*, D12*d*, . . . , D1w*d*, where w is the number of the sub-data signals. Similarly, the nth data signal D1*n* may include the plurality of sub signals Dn1*d*, Dd2*d*, . . . , Dnw*d*. Each of the control signals A1*d*, A2*d*, . . . , An*d* may include a first sub-control signal and a second sub-control signal. For example, the first data signal A1*d* may include the first sub-control signal A1Dd and the second sub-control signal A1Cd. Similarly, the nth control signal A1*n* may include the first sub-control signal AnDd and the second sub-control signal AnCd.

Each of the switching elements 1211*d*, 1212*d*, . . . , 121*nd* may include a first multiplexer MX1 and a second multiplexer MX2. The first multiplexer MX1 may receive a corresponding data signal from the data processing unit 110 of FIG. 1. The first multiplexer MX1 may perform a first multiplexing operation on input data signal based upon the first sub-control signal where the input data signal include a plurality of sub-data signals transmitted in parallel. The first multiplexer MX1 may output a first multiplexed data signal as result of the first multiplexing operation. The second multiplexer MX2 may output a second multiplexed signal by performing second multiplexing operation on the first multiplexed data signal and an output signal of a previous switching element connected to the switching element, based upon the second sub-control signal. For example, the first multiplexer MX1 of the first switching element 1211d may output the first multiplexed data signal by sequentially multiplexing the sub-data signals D11d, D12d, . . . , D1wd based upon the first sub-control signal A1Dd. In this case, the multiplexed data signal represents one signal selected among the sub-data signals D11d, D12d, . . . , D1wd. The second multiplexer MX2 of the first switching element 1211d may output the second multiplexed data signal by multiplexing the first multiplexed data signal and the initialization data I based upon the second sub-control signal A1Cd. Similarly, the first multiplexer MX1 of the first switching element 121nd may output the first multiplexed data signal by sequentially multiplexing the sub-data signals Dn1d, Dn2d, . . . , Dnwd based upon the first sub-control signal AnDd. The second multiplexer MX2 of the first switching element 121nd may output the second multiplexed data signal by multiplexing the first multiplexed data signal and the output signal of the previous switching element 121n−1d based upon the second sub-control signal A1Cd. In an exemplary embodiment, the first multiplexer MX1 of the even switching elements can be arranged adjacent to the data processing unit 110 of FIG. 1. In another exemplary embodiment, the first multiplexer MX1 of the even switching elements can be arranged adjacent to the corresponding second multiplexer MX2.

For convenience of illustration again, FIG. 2D shows that the number of the sub-data signals are the same with 'w' for each of the data signals D1d, D2d, . . . , Dnd. The data signals D1d, D2d, . . . , Dnd may have different number of sub-data signals when compared to each other.

The delay chain unit 120d of FIG. 2D is similar to the delay chain unit 120a of FIG. 2A, except that each of the data signals includes the plurality of sub-data signals, that each of the control signals includes the first-control signal and the second-control signal, and that each of the switching elements 1211d, 1212d, . . . , 121nd has an additional multiplexer to perform the first multiplexing operation on the sub-data signals. Thus a repeated description will be omitted.

Referring to FIG. 2E, the delay chain unit 120e may include the first switching element 1211e, the second switching element 1212e, . . . , the nth switching element 121ne that are controlled to output a first data stream DOUTe1 and a second data stream DOUTe2 by performing pipelining operations on the data signals D1e, D2e, D3e, D4e, . . . , Dn−1e, Dne (n is an even number) based upon the respective control signals A1e, A2e, A3e, A4e . . . , An−1e, Ane. The odd switching elements 1211e, 1213e, . . . , 121n−1e are connected in series to each other and the even switching elements 1212e, 1214e, . . . , 121ne are connected in series to each other, so that two data streams DOUTe1, DOUTe2 are output from a first delay chain CH1 and a second delay chain CH2, respectively. For example, the odd switching elements 1211e, 1213e, . . . , 121n−1e are connected in an ascending order from 1211e to 12n−1e where the (n−1)th switching element 121n−1e outputs the first data stream DOUTe1 that corresponds to the result of the sequential pipelining operations performed on the odd data signals D1, D3, . . . , Dn−1. Similarly, the even switching elements 1212e, 1214e, . . . , 12ne are connected in an ascending order from 1212e to 12ne where the nth switching element 121ne outputs the second data stream DOUTe2 that corresponds to the result of the sequential pipelining operations performed on the odd data signals D2, D4, . . . , Dn.

The switching elements 1211e, 1212e, 1213e, 1214e, . . . , 121n−1e, 121ne may receive data signals D1e, D2e, D3e, D4e . . . , Dn−1e, Dne, respectively. Where the odd switching elements 1211e, 1213e, . . . , 121n−1e are connected in the ascending order as illustrated in FIG. 2E, the first switching element 1211e may receive a first initialization data Ie1 as well as the first data signal D1e. Where the even switching elements 1212e, 1214e, . . . , 12ne are connected in the ascending order as illustrated in FIG. 2E, the second switching element 1211e may receive a second initialization data Ie2 as well as the second data signal D2.

The delay chain unit 120e may include two delay chains CH1, CH2. The first delay chain CH1 may be formed using the odd switching elements 1211e, 1213e, . . . , 121n−1e and second chain CH2 may be formed using the even switching elements 1212e, 1214e, . . . , 12ne. The delay chains CH1, CH2 may be arranged in parallel. As described above, the delay chain unit 120e may output two data streams DOUTe1, DOUTe2 through respective delay chains CH1, CH2. The first delay chain CH1 may output the first data stream DOUTe1 representing the odd data signals D1e, D3e, . . . , Dn−1e that are pipelined based upon the odd control signals A1e, A3e, . . . , An−1e, respectively. Similarly, the second delay chain CH2 may output the second data stream DOUTe2 representing the even data signals D2e, D4e, . . . , Dne that are pipelined based upon the even control signals A2e, A4e, . . . , Ane, respectively.

As illustrated in FIG. 2E, each of the data signals D1e, D2E, . . . , DnE may include a plurality of sub-data signals. For example, the first data signal D1e may include the plurality of sub signals D11e, D12e, . . . , D1we, where w is the number of the sub-data signals. Similarly, the nth data signal D1n may include the plurality of sub signals Dn1e, Dd2e, . . . , Dnwe. Each of the control signals A1e, A2e, . . . , Ane may include a first sub-control signal and a second sub-control. For example, the first data signal A1e may include the first sub-control signal A1De and the second sub-control signal A1Ce. Similarly, the nth control signal A1e may include the first sub-control signal AnDe and the second sub-control signal AnCe.

Each of the switching elements 1211e, 1212e, . . . , 121ne may include a first multiplexer MX1 and a second multiplexer MX2. The first multiplexer MX1 may receive a corresponding data signal from the data processing unit 110 of FIG. 1. The first multiplexer MX1 may perform a first multiplexing operation on an input data signal based upon the first sub-control signal where the input data signal includes a plurality of sub-data signals transmitted in parallel. The first multiplexer MX1 may output a first multiplexed data signal as result of the first multiplexing operation. The second multiplexer MX2 may output a second multiplexed signal by performing a second multiplexing operation on the first multiplexed data signal and an output signal of a previous switching element connected to the switching element, based upon the second sub-control signal. For example, the first multiplexer MX1 of the first switching element 1211e may output the first multiplexed data signal by sequentially multiplexing the sub-data signals D11e, D12e, . . . , D1we based upon the first sub-control signal A1De. In this case, the multiplexed data signal represents one signal selected among the sub-data signals D11e, D12e, . . . , D1we. The second multiplexer MX2 of the first switching element 1211e may output the second multiplexed data signal by multiplexing the first multiplexed data signal and the initialization data I based upon the second sub-control signal A1Ce. Similarly, the first multiplexer MX1 of the first switching element 121ne may output the first multiplexed data signal by sequentially multiplexing the sub-data signals Dn1e, Dn2e, . . . , Dnwe based upon the first sub-control signal AnDe. The second multiplexer MX2 of the first switching element 121ne may output the second multiplexed data signal by multiplexing the first multiplexed data signal and the output signal of the previous switching element 121n-1e based upon the second sub-control signal A1Ce. In an exemplary embodiment, the first multiplexers MX1 of the even switching elements can be arranged adjacent to the data processing unit 110 of FIG. 1. In another exemplary embodiment, the first multiplexers MX1 of the even switching elements can be arranged adjacent to the corresponding second multiplexers MX2.

For convenience of illustration again, FIG. 2E shows that the number of the sub-data signals are the same with 'w' for each of the data signals D1e, D2e, . . . , Dne. The data signals D1e, D2e, . . . , Dne may have a different number of sub-data signals when compared to each other. For convenience of illustration again, FIG. 2E shows that the data signals are divided into odd data signals D1e, D3e, . . . , Dn-1e and even data signals D2e, D4e, . . . , Dne and output through the respective delay chains CH1, CH2. The delay chains CH1, CH2 may be formed to output some data signals selected from the data signals D1, D2, D3, D4, . . . , Dn-1, Dn.

The delay chain unit 120e of FIG. 2E is similar to the delay chain unit 120d of FIG. 2D, except that the switching elements 1211e, 1212e, . . . , 121ne are connected each other to form a two delay chains CH1, CH2 that output data streams DOUTe1, DOUTe2 respectively, and thus a repeated description will be omitted.

Referring to FIG. 2F, the delay chain unit 120f may include the first switching element 1211f, the second switching element 1212f, . . . , the nth switching element 121nf that are controlled to output a data stream DOUTf by performing pipelining operations on the data signals D1f, D2f, . . . , Dnf based upon the control signals A1f, A2f, . . . , Anf. The switching elements 1211f, 1212f, . . . , 121nf are connected in series to each other so that one data stream DOUTf is output from the delay chain unit 120f. As illustrated in FIG. 2F, each of the data signals D1f, D2f, . . . , Dnd may include a plurality of sub-data signals. For example, the first data signal D1d may include the plurality of sub signals D11f, D12f, . . . , D1wf, where w is the number of the sub-data signals. Similarly, the nth data signal D1n may include the plurality of sub signals Dn1f, Dd2f, . . . , Dnwf.

The switching elements 1211f, 1212f, . . . , 121nf may be (w+1):1 multiplexers that output one signal selected from (w+1) signals based upon the controls signals A1f, A2f, . . . , Anf, respectively. The (w+1) signals may include w of data signals received from the data processing unit 110 of FIG. 1 and a signal transmitted from the previous switching element (or the initialization data signal I). As illustrated in FIG. 2F, the switching elements 1211f, 1212f, . . . , 121nf are connected in the ascending order, and thus the ith switching element 121if may receive a selected signal from the (i-1)th switching element 121(i-1)f.

The control signals A1f, A2f, . . . , Anf may be multiple bit signals to control the multiplexing operation of the respective switching elements 1211f, 1212f, . . . , 121nf. For example, when w is 7, each of the control signals A1f, A2f, . . . , Anf may represent 3 bit control signals to select one from (7+1) candidates input to each of the switching elements.

For convenience of illustration again, FIG. 2F shows that the number of the sub-data signals are the same with 'w' for each of the data signals D1f, D2f, . . . , Dnf. The data signals D1f, D2f, . . . , Dnf may have a different number of sub-data signals when compared to each other.

The delay chain unit 120f of FIG. 2F is similar to the delay chain unit 120a of FIG. 2A, except that the switching elements 1211f, 1212f, . . . , 121nf are (w+1):1 and the control signals may accordingly have multiple-bit signals. Thus a repeated description will be omitted.

Figure 2G:
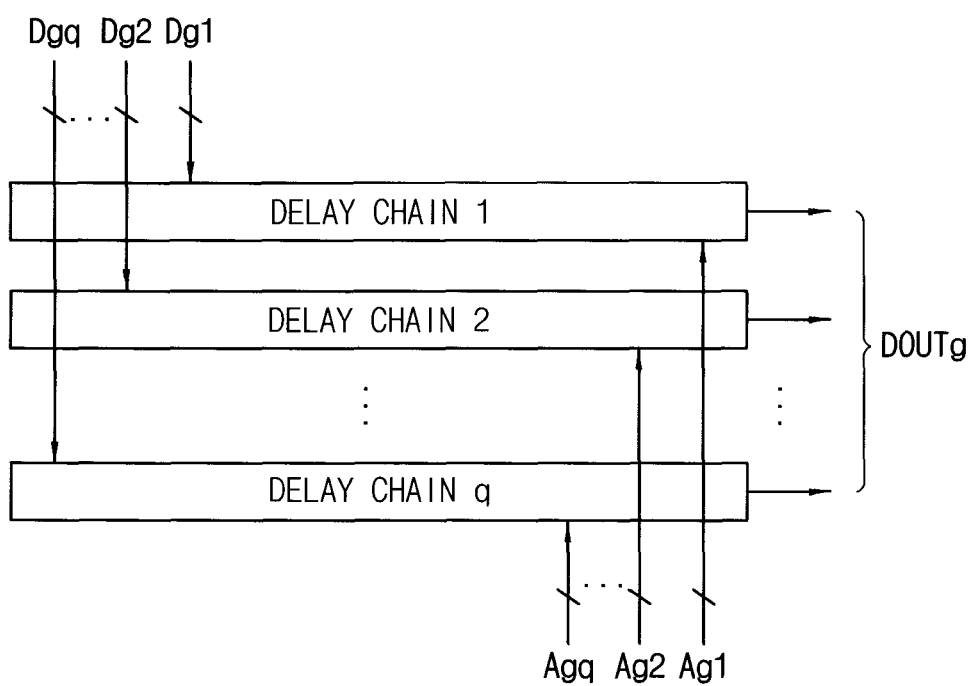
FIG. 2G is a block diagram illustrating an exemplary embodiment of the delay chain unit in the data transmission device of FIG. 1.

FIG. 2G is a block diagram illustrating an exemplary embodiment of delay chain unit in the data transmission device of FIG. 1. FIG. 2G illustrates a seventh exemplary embodiment where the delay chain 120 output q (q being a natural number) of data streams based upon the data signals D1, D2, . . . , Dn.

Referring to FIG. 2G, the delay chain unit 120g may include a first delay chain through a qth delay chain (q being a natural number). The plurality of the delay chains may output a plurality of data streams DOUTg. Each of the delay chains may perform pipelining operations on a group of data signals based upon a group of control signals. For example, the first delay chain may perform pipelining operations on a first group of data signals Dg1 based upon a first group of control signals Ag1. Similarly, the qth delay chain may perform pipelining operations on a first group of data signals Dgq based upon a qth group of control signals Agq.

The delay chain unit 120g of FIG. 2G is similar to the delay chain unit 120c of FIG. 2C, except that the delay chain unit 120g has more than 2 delay chains, and thus a repeated description will be omitted.

FIG. 3 is a block diagram illustrating an exemplary embodiment of the data transmission device of FIG. 1.

Referring to FIG. 3, the data transmission device 100a includes a control unit 130a, a signal processing unit 110a and a delay chain unit 120a0. FIG. 3 illustrates an exemplary embodiment combining the delay chains of FIGS. 2A and 2B in cascade.

The signal processing unit 110a may include a first signal processing block 110a1 and a second signal processing block 110a2. The delay chain unit 120a0 may include a first delay chain 120a1 and a second delay chain 120a2. The control unit 130a may include a first control block 130a1 and a second control block 130a2.

The first signal processing block 110a1 may provide n1 data signals (n1 being a natural number) in a row to the first delay chain 120a1. The second signal processing block 110a2 may provide n2 data signals (n2 being a natural number) in a row to the second delay chain 120a2. The first control block 130a1 may provide n1 control signals to the first delay chain 120a1. The second control block 130a2 may provide n2 control signals to the second delay chain 120a2. The first chain 120a1 may output one signal selected from the n1 data signals based upon the n1 control signals. The second chain 120a2 may output one signal selected from the n2 data signals based upon the n2 control signals. The first delay chain 120a1 may have a configuration similar to the configuration illustrated in FIG. 2B and the second delay chain 120a2 may have a configuration similar to the configuration illustrated in FIG. 2A As illustrated in FIG. 3, the data transmission configuration according to the exemplary embodiment of the inventive concept may be integrated into electronic devices having several functional blocks. The data transmission device 101 of FIG. 3 is similar to the data transmission device 100 of FIG. 1 when n1+n2 is equal to n, and thus a repeated description will be omitted.

FIGS. 4A and 4B are timing diagrams illustrating data transmission operations according to exemplary embodiments. For convenience of illustration FIGS. 4A and 4B show cases of transmitting only four data signals D1, D2, D3, D4 as a data stream DOUT using four switching elements that performing the pipelining operations based upon four respective control signals A1, A2, A3, A4. FIG. 4A illustrates a case where the data transmission device 100 outputs the data signals D1, D2, D3, D4 in ascending order. On the other hand, FIG. 4B illustrates a case where the data transmission device 100 outputs the data signals D1, D2, D3, D4 in descending order.

Each of the data signals D1, D2, ... D4 is output through the delay chain unit 120 after an output delay in response to activation or deactivation of the control signals. The output delay can be calculated by summing RC delays of wires and the propagation delays of the switching elements which the data signal pass through. The RC delays indicate delays caused by parasitic capacitance and resistance of the wires between the switching elements. For convenience of explanation, the RC delays are not considered in FIGS. 4A and 4B.

Hereinafter, data transmission operations according to exemplary embodiments of the present inventive concept will be described with reference to FIGS. 2A, 4A and 4B.

The delay chain unit 120*a* may output the data stream DOUT that is associated with four data signals D1, D2, D3, D4, in response to the respective control signals A1, A2, A3, A4. When the first control signal A1 is activated or has an activation logic level, the first switching element 1211*a* may output the first data signal D1 as the data stream DOUT, where td represents the propagation delay of the switching element. In this case, the first control signal A1 is activated after a first propagation delay of 4 td. The first propagation delay represents a time interval during which the first data signal D1 propagates four switching elements 1211*a*, 1212*a*, 1213*a*, 1214*a*. During the first data signal D1 propagating the four switching elements, the second through the fourth control signals A2, A3, A4 may be deactivated or have a deactivation logic level. Thus, after the first control signal A1 is activated, the second switching elements may receive the first data signal D1 and output the received first data signal D1 to the third switching element while the second control signal A2 remains deactivated. When the second control signal A2 is activated or has an activation logic level, the second switching element 1212*a* outputs the second data signal D2 as the data stream DOUT. In this case, the first control signal A2 is activated after a second propagation delay of 3 td. The second propagation delay represents a time interval during which the second data signal D2 propagates three switching elements 1212*a*, 1213*a*, 1214*a*. The third and the fourth switching elements may function based upon the respective control signals A3, A4, similarly to the second switching element, and thus a repeated description will be omitted.

As described above, when the control signals A1, A2, A3, A4 are activated in the ascending order with time intervals t1*b* as illustrated in FIG. 4A, the data stream DOUT may have a data duration time of (t1*b*−td) for each of the data signals D1, D2, D3, D4. Thus, the data duration time for each data signal of the data stream DOUT is different from activation interval of t1*b* between two consecutively activated control signals. The activation interval represents the time difference between activation timings of the two consecutively activated control signals. For example, the second control signal A2 is activated at a second activation timing which is later by t1*b* than a first activation timing of the first control signal A1.

Each of the switching elements may operate in various modes, for example, an activation mode and a deactivation mode. During the activation mode, the switching element may receive the activated control signal and may output the received data signal rather than outputting the transmitted signal from the previous switching element. During the deactivation mode, the switching element may receive the deactivated control signal and may output the transmitted signal from the previous switching element.

In an exemplary embodiment, as shown in FIG. 4A, the control signals A1, A2, A3, A4 may be transitioned to the deactivation level after the data signals D1, D2, D3, D4 are completely output as data stream DOUT. In other exemplary embodiments, the ith control signal Ai may be transitioned from the activation level to the deactivation level after the (i+1)th control signal A(i+1) is activated. In this case the delay chain unit 120*a* may operate similarly to the case when the control signals A1, A2, A3, A4 are maintained at the activation level until the delay chain unit 120*a* outputs completely the data signals D1, D2, D3, D4.

Referring again to FIGS. 2B and 4A, the first switching element 1211*b* may output the first data signal D1 while the first control signal A1 remains activated. In another exemplary embodiment, the first switching element may have a function of outputting the first data signal D1 while the first control signal A1 remains deactivated.

Contrary to FIG. 4A, FIG. 4B illustrates a case where the data transmission device 100 outputs the data signals D1, D2, D3, D4 in the descending order. When the activation interval between the activation timings of two consecutively activated control signals is (t1*b*−td), the data duration time is t1*b* of the data stream DOUT because td is the propagation delay of each switching element. Accordingly, the FIG. 4B indicates that the data duration time of the data stream DOUT may be adjusted by controlling the activation interval between such two consecutively activated control signals.

Alternatively, according to an exemplary embodiment, the control signals A1, A2, A3, A4 may be controlled to be activated in any predetermined order instead of in the ascending/descending orders as illustrated in FIGS. 4A and 4B, so that the data signals D1, D2, D3, D4 may be output in the predetermined order.

The data transmission operation shown in FIG. 4B is similar to the previous embodiment except that the control signals A1, A2, A3, A4 are activated or deactivated in a reversed order as compared to FIG. 4A and thus the data signals D1, D2, D3, D4 are output in the descending order. Hence, a repeated description will be omitted.

Figure 5:
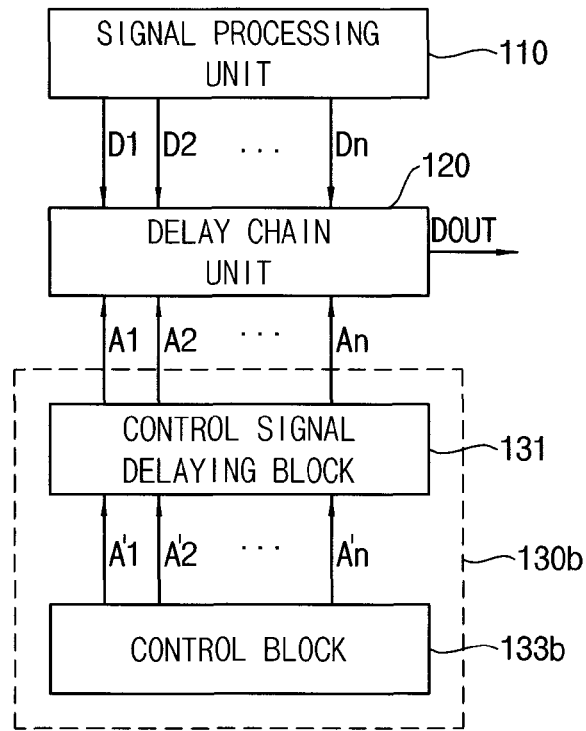
FIG. 5 is a block diagram illustrating an exemplary embodiment of the data transmission device of FIG. 1.

FIG. 5 is a block diagram illustrating an exemplary embodiment of the data transmission device of FIG. 1.

Referring to FIG. 5, the data transmission device 100*b* includes a signal processing unit 110, a delay chain unit 120 and a control unit 130*b*.

The control unit 130*b* may include a control block 133*b* and a control signal delaying block 131. The control signal delaying block 131 may delay each of the switching activation signals A'1, A'2, ..., A'n and may provide the delayed switching activation signals as the control signals A1, A2, ..., An to the delay chain unit 120.

The data transmission device 100*b* of FIG. 5 is similar to the data transmission device 100 of FIG. 1, except that the control unit 130*b* further includes the control signal delaying block 131, and thus a repeated description will be omitted.

Figure 6:
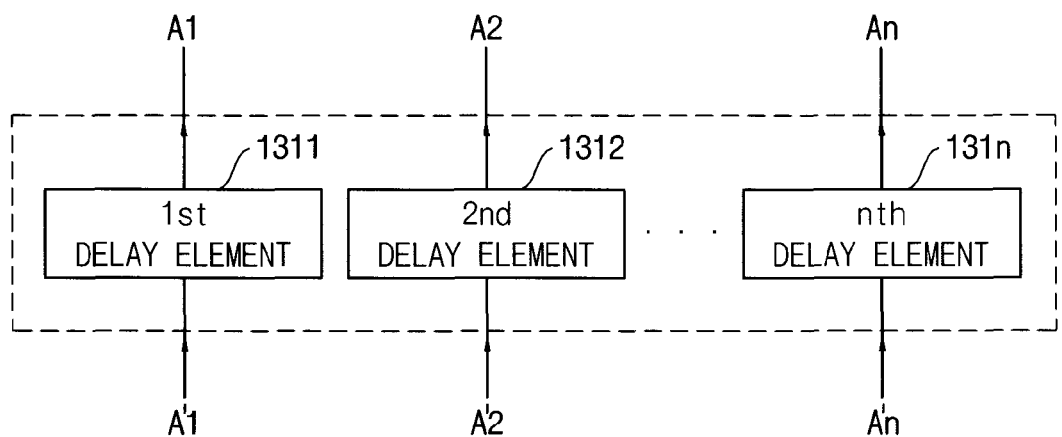
FIG. 6 is a block diagram illustrating an exemplary embodiment of the control signal delay unit in the data transmission device of FIG. 5.

FIG. 6 is a block diagram illustrating an exemplary embodiment of the control signal delay unit 131 in the data transmission device of FIG. 5.

Referring to FIG. 6, the control signal delaying block 131 may include a first delay element 1311 through an nth delay element 131*n*. The delay elements 1311, 1312, ..., 131*n* may have substantially the same propagation delays with the respective switching elements of the delay chain unit 120. For example, the ith delay element 131*i* may have substantially the same propagation delay with the ith switching element of the delay chain unit 120. In this case, the delay chain unit 120 may have various configurations such as illustrated in FIGS. 2A through 2G.

Figure 7:
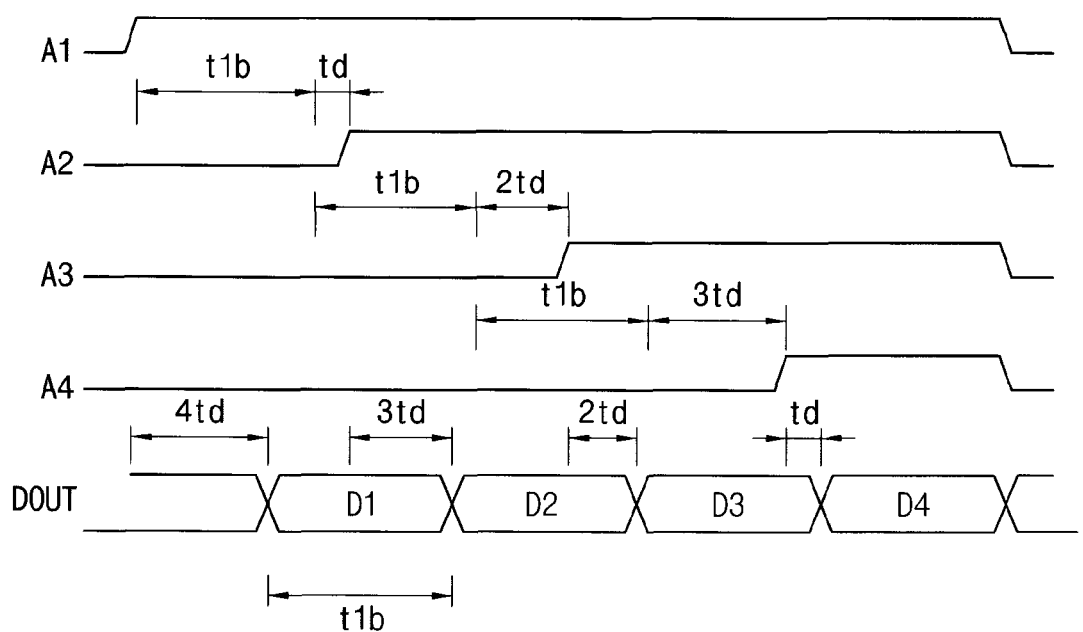
FIG. 7 is timing diagrams illustrating a data transmission operation according to an exemplary embodiment.

FIG. 7 is a timing diagram illustrating a data transmission operation according to an exemplary embodiment. For convenience of illustration FIG. 7 shows a case of transmitting only four data signals D1, D2, D3, D4 as a data stream DOUT using four switching elements that performing the pipelining operations based upon four respective control signals A1, A2, A3, A4. For convenience of explanation, the RC delays of the wires between the switching elements which the data signals pass through are not considered in FIG. 7.

Hereinafter, data transmission operations according to exemplary embodiments will be described with reference to FIGS. 2A, 5 and 7.

As shown in FIG. 7, the data transmission device 100b of FIG. 5 may output the data signals D1, D2, D3, D4 as the data stream DOUT, in the ascending order. When the first control signal A1 is activated or has an activation logic level, the first switching element 1211a may output the first data signal D1 as the data stream DOUT. In this case, the first control signal A1 is activated after a first propagation delay of 4 td. During the first data signal D1 propagating four switching elements, the second through the fourth control signals A2, A3, A4 may be deactivated or have a deactivation logic level. Thus, after the first control signal A1 is activated, the second switching element 1212a may receive the first data signal D1 and output the received first data signal D1 to the third switching element while the second control signal A2 remains deactivated. When the second control signal A2 is activated or has an activation logic level, the second switching element 1212a outputs the second data signal D2 as the data stream DOUT. In this case, the first control signal A2 is activated after a second propagation delay of 3 td. The third and the fourth switching elements may function based upon the respective control signals A3, A4, similarly to the second switching element 1212a, and thus a repeated description will be omitted.

When the activation interval between two consecutively activated control signals is (t1b+td), the data duration time is t1b of the data stream DOUT because of the propagation delays of the switching elements which the data signals D1, D2, D3, D4 pass through. Compared to the control signals in FIG. 4, the activation timings of the control signals A1, A2, A3, A4 in FIG. 7 are delayed by 0, td, 2 td and 3 td, respectively, with respect to those of the control signals in FIG. 4A. Accordingly, as illustrated in FIG. 7, the data duration time of the data stream DOUT may be adjusted by controlling the intervals between such activation timings.

The control signal delaying block 131 of FIG. 5 may delay the control signals A1, A2, A3, A4 illustrated in FIG. 4A by 0, td, 2 td and 3 td, respectively, and may output the control signals A1, A2, A3, A4 illustrated in FIG. 7 to the delay chain unit 120 of FIG. 5. Thus, the control signal delaying block 131 of FIG. 5 may adjust the data duration time of the data stream DOUT to by delaying such activation timings of the control signals A1, A2, A3, A4 as described above.

Figure 8:
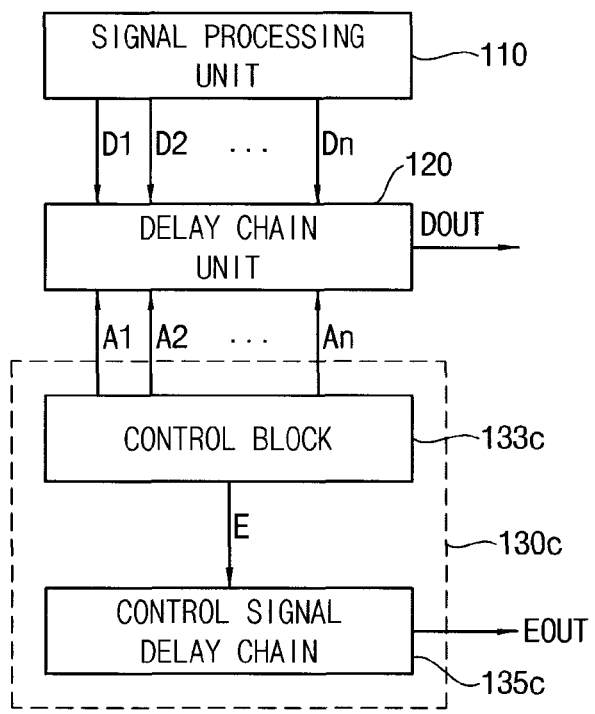
FIG. 8 is a block diagram illustrating an exemplary embodiment of the data transmission device of FIG. 1.

FIG. 8 is a block diagram illustrating an exemplary embodiment of the data transmission device of FIG. 1.

Referring to FIG. 8, the data transmission device 100c includes a signal processing unit 110, a delay chain unit 120 and a control unit 130c.

The control unit 130c may include a control block 133c and a control signal delay chain 135c. The control signal delay chain 135c may output the transmission enable signal EOUT by delaying the transmission-start signal E by the output delay of the delay chain unit 120. The transmission enable signal EOUT may include information on the transmission timing of valid data stream DOUT. For example, the transmission enable signal EOUT may be a one-bit signal that is activated when the at least one of the data signals D1, D2, . . . , Dn is output as the data stream DOUT. The transmission-start signal E may be activated when at least one of the control signals A1, A2, . . . , An is activated. In this case, before activating the at least one of the control signals A1, A2, . . . , An, the data transmission device 100c may be in a initialization mode, during which the control signals A1, A2, . . . , An remain deactivated. For example, the control signal delay chain 135c may delay the transmission-start signal E by a pre-defined time delay that corresponds to the output delay of the data transmission device 100c. The output delay of the data transmission device 100c represents a time interval between an activation timing of a control signal that is activated in advance to the other control signals and an output timing of a data signal corresponding to the control signal.

For example, when delay chain unit 120 output the data signals D1, D2, . . . , Dn in the ascending order, the output delay of the data transmission device 100c may correspond to n times of the propagation delay of the switching element, where the RC delay is not considered. As an exemplary embodiment, when delay chain unit 120 outputs the data signals D1, D2, . . . , Dn in the descending order, the output delay of the data transmission device 100c may correspond to the propagation delay of the switching element, where the RC delay is not considered.

The signal processing unit 110 and the delay chain unit 120 of FIG. 8 are substantially the same with the signal processing unit 110 and the delay chain unit 120 of FIG. 1. Further, the control unit 130c of FIG. 8 is similar to the control unit 130 of FIG. 1 except that the control unit 130c further includes the control signal delay chain 135c. Thus a repeated description will be omitted.

Figure 9:
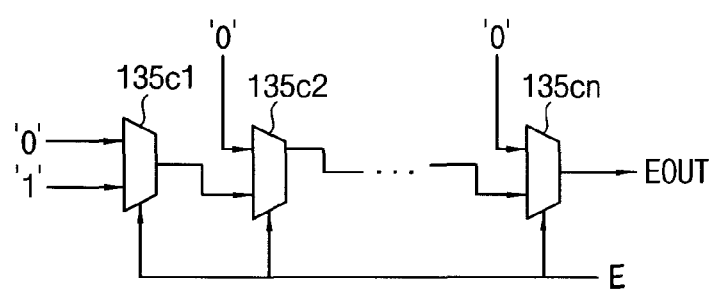
FIG. 9 is a circuit diagram illustrating an exemplary embodiment of a control signal delay chain unit in the data transmission device of FIG. 8.

FIG. 9 is a circuit diagram illustrating an exemplary embodiment of a control signal delay chain unit in the data transmission device of FIG. 8.

Referring to FIG. 9, the control signal delay chain 135c may include a first delay element 135c1, a second delay element 135c2, . . . , a nth delay element 135cn. The delay elements 135c1, 135c2, . . . , 135cn are connected in series to each other so that the nth delay element 135cn outputs the transmission enable signal EOUT. The delay elements 135c1, 135c2, . . . , 135cn may have substantially the same propagation delays with the switching elements of the delay chain unit 120, respectively. In an exemplary embodiment, as illustrated in FIG. 9, each of the delay elements 135c1, 135c2, . . . , 135cn may correspond to each of the respective switching elements 1211a, 1212a, . . . , 121na of FIG. 2A, and thus may be a 2:1 multiplexer. In this case, each of the delay elements 135c1, 135c2, . . . 135cn may output a logic high signal (e.g., digital '1') as the transmission enable signal EOUT in response to the transmission-start signal E. In another exemplary embodiment, the control signal delay chain 135c may include a single delay element that delays the transmission-start signal E by output delay of the delay chain unit 120.

Figure 10:
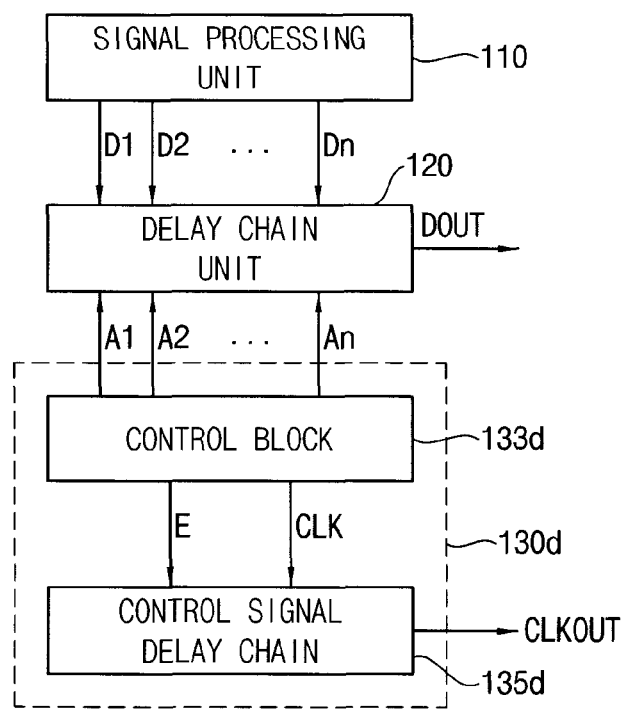
FIG. 10 is a block diagram illustrating an exemplary embodiment of the data transmission device of FIG. 1.

FIG. 10 is a block diagram illustrating an exemplary embodiment of the data transmission device of FIG. 1.

Referring to FIG. 10, the data transmission device 100d includes a signal processing unit 110, a delay chain unit 120 and a control unit 130d.

The control unit 130d may include a control block 133d and a control signal delay chain 135d. The control signal delay chain 135d may output a data clock signal CLKOUT by delaying a clock signal CLK by the output delay of the delay chain unit 120. The data clock signal CLKOUT may include information on the transmission timings of the data signals D1, D2, . . . , Dn. For example, the data clock signal CLKOUT may be a rectangular signal having a period corresponding to data duration time of the data stream DOUT. Each clock of the data clock signal CLKOUT may have falling edge or rising edge at a time point within a corresponding data duration interval of the data stream DOUT. In this case, before activating the at least one of the control signals A1, A2, . . . , An, the data transmission device 100c may be in an initialization mode during which the control signals A1, A2, . . . , An remain deactivated. For example, the control signal delay chain 135c may delay the clock signal CLK by a pre-defined time delay that corresponds to the output delay of the data transmission device 100d. The output delay of the data transmission device 100d represents a time interval between when the data signals D1, D2, . . . , Dn are input to the delay chain unit 120, and when the data signals D1, D2, . . . , Dn are first output as the data stream DOUT. In an exemplary embodiment, the data clock signal CLKOUT may be enabled in response to the transmission-start signal E.

For example, when delay chain unit 120 output the data signals D1, D2, . . . , Dn in the ascending order, the output delay of the data transmission device 100d may correspond to n times of the propagation delay of the switching element, where the RC delay is not considered. As in exemplary embodiment, when delay chain unit 120 outputs the data signals D1, D2, . . . , Dn in the descending order, the output delay of the data transmission device 100d may correspond to the propagation delay of the switching element, where the RC delay is not considered.

The signal processing unit 110 and the delay chain unit 120 of FIG. 10 are substantially the same as the signal processing unit 110 and the delay chain unit 120 of FIG. 1. Further, the control unit 130d of FIG. 10 is similar to the control unit 130 of FIG. 1 except that the control unit 130d further includes the control signal delay chain 135d. Thus a repeated description will be omitted.

Referring again to FIG. 8 and FIG. 10, in exemplary embodiments of the present inventive concept the control signal delay chain 135d may be implemented to further output the transmission enable signal EOUT as well as output the data clock signal CLKOUT.

Figure 11:
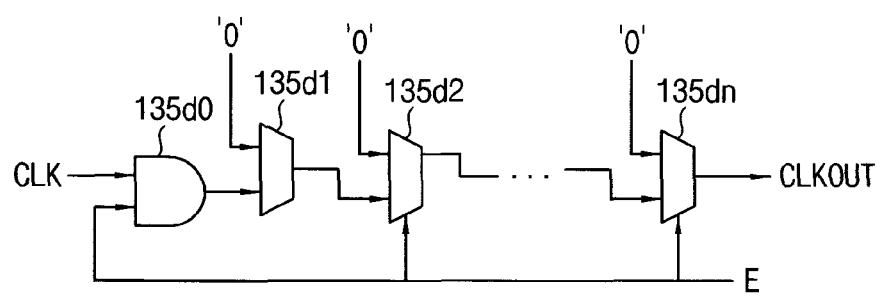
FIG. 11 is a circuit diagram illustrating an exemplary embodiment of a control signal delay chain unit in the data transmission device of FIG. 10.

FIG. 11 is a circuit diagram illustrating an exemplary embodiment of a control signal delay chain unit in the data transmission device of FIG. 10.

Referring to FIG. 11, the control signal delay chain 135d may include an AND gate 135d0, a first delay element 135d1, a second delay element 135d2, . . . , a nth delay element 135dn. The AND gate 135d0 and the delay elements 135d1, 135d2, . . . , 135dn are connected in series to each other so that the nth delay element 135dn outputs the data clock signal CLKOUT. The AND date 135d0 receives the clock signal CLK and the transmission-start signal E and performs the AND operation on the received signals to output the operated signal to the first delay element 135d1. That is, in this case, transmission of the clock signal CLK is enabled only when the transmission-start signal E remains activated. The delay elements 135d1, 135d2, . . . , 135dn may have substantially the same propagation delays with the switching elements of the delay chain unit 120, respectively. In an exemplary embodiment, as illustrated in FIG. 9, each of the delay elements 135d1, 135d2, . . . , 135dn may corresponds to each of the respective switching elements 1211a, 1212a, . . . , 121na of FIG. 2A, and thus may be a 2:1 multiplexer. In this case, each of the delay elements 135d1, 135d2, . . . , 135dn may output a delayed clock signal as the data clock signal CLKOUT in response to the transmission-start signal E. According to the described exemplary embodiments, the data transmission device 100d may further include a clock generator (not shown) that generates the clock signal CLK.

In other exemplary embodiments, the control signal delay chain 135d may include a single delay element that delays the transmission-start signal E by output delay of the delay chain unit 120. In this case, the control signal delay chain 135d may output the data clock signal CLKOUT by merely delaying the clock signal CLK using the single delay element and may output the data clock signal CLKOUT.

Figure 12A:
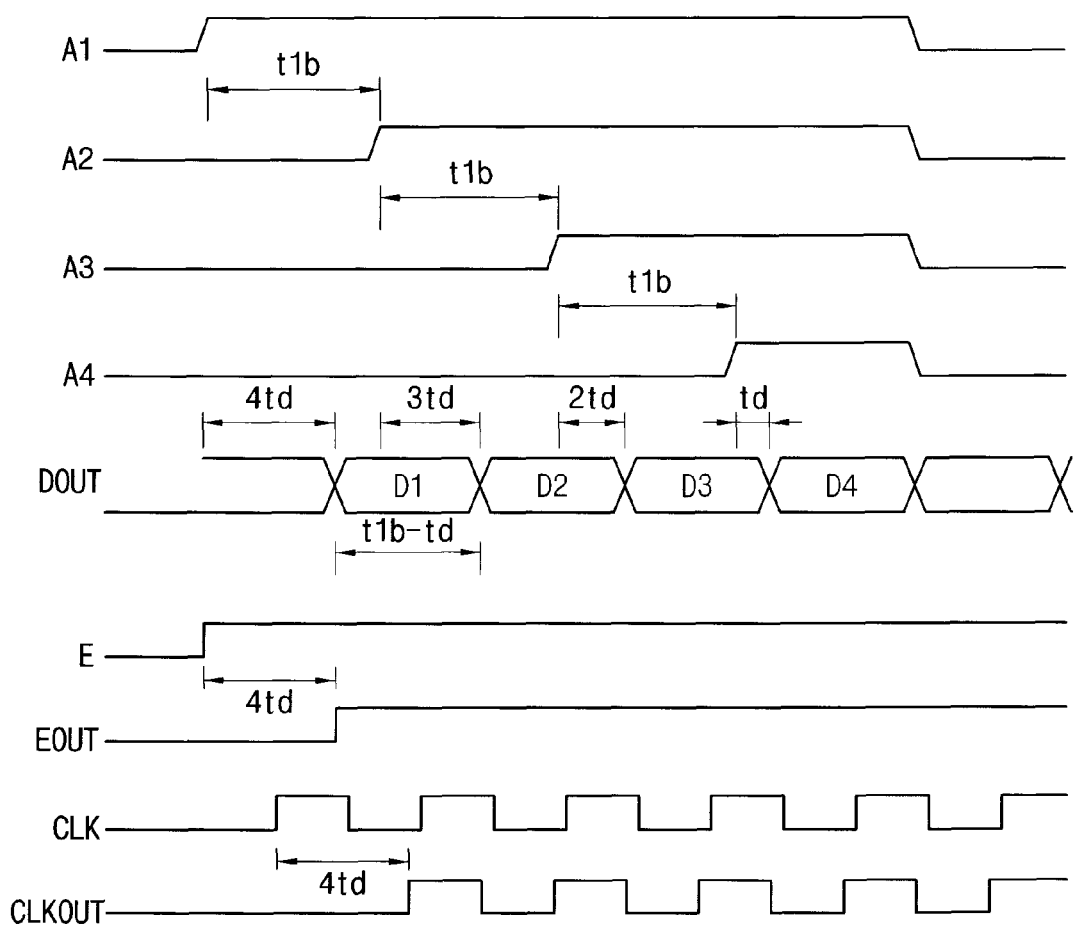
FIGS. 12A and 12B are timing diagrams for explaining data transmission according to exemplary embodiments.
Figure 12B:
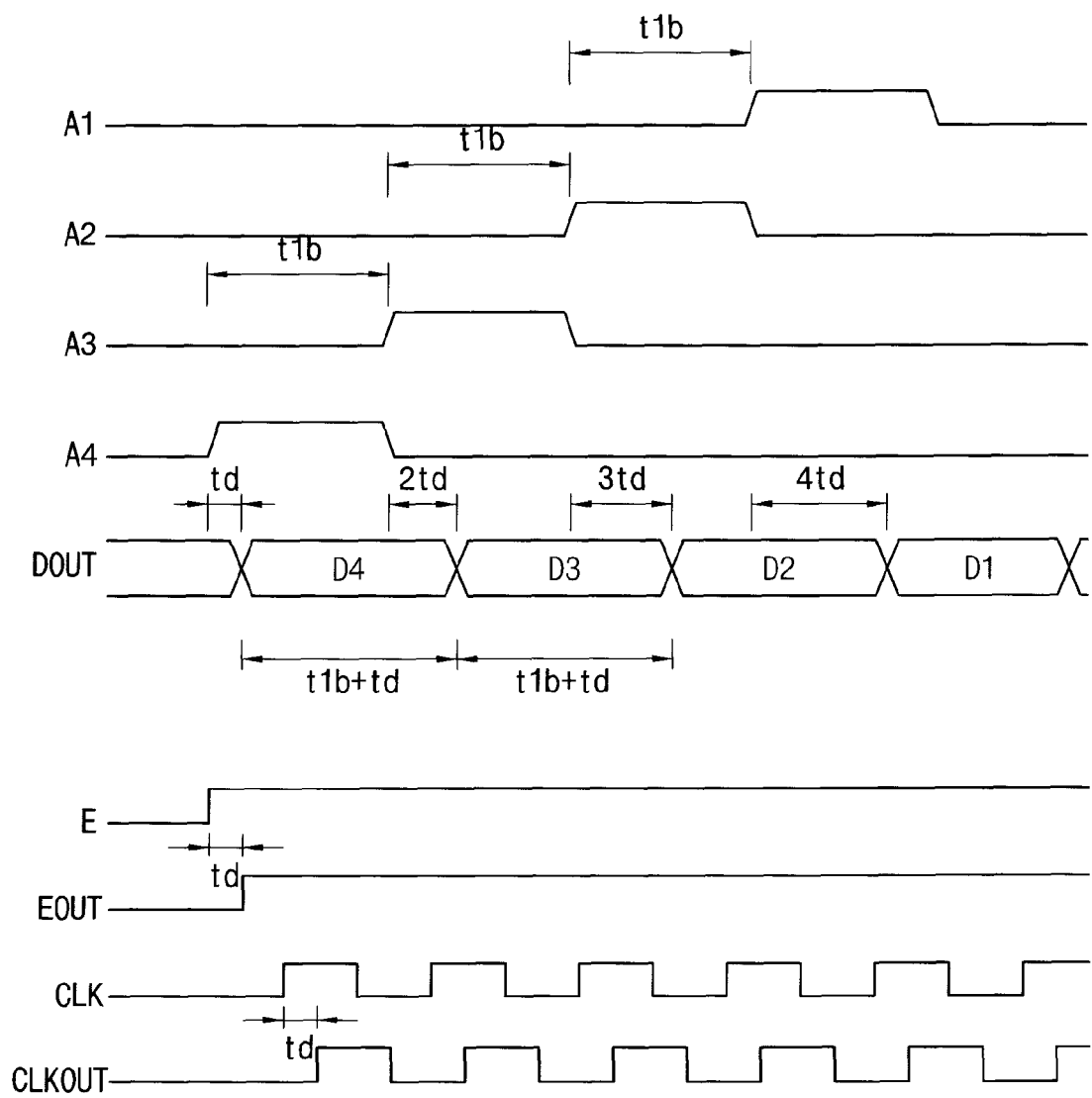

FIGS. 12A and 12B are timing diagrams for explaining data transmission according to exemplary embodiments. For convenience of illustration FIGS. 12A and 12B show cases of transmitting only four data signals D1, D2, D3, D4 as a data stream DOUT using four switching elements that perform the pipelining operations based upon four respective control signals A1, A2, A3, A4. FIG. 12A illustrates a case where the data transmission device 100 outputs the data signals D1, D2, D3, D4 in the ascending order. Contrarily, FIG. 12B illustrates another case where the data transmission device 100 outputs the data signals D1, D2, D3, D4 in the descending.

Referring again to FIGS. 9, 11 and 12A, the control signal delay chain 135c may output the transmission enable signal EOUT. The transmission enable signal EOUT is delayed by 4 td with respect to the transmission-start signal E. The transmission-start signal E may be activated when the first control signal A1 is activated. The control signal delay chain 135d may output the data clock signal CLKOUT. The data clock signal CLKOUT is delayed by 4 td with respect to the clock signal CLK. As described above, 4 td corresponds to the propagation delay of the four switching elements outputting the respective control signals A1, A2, A3, A4.

Referring again to FIGS. 9, 11 and 12B, the control signal delay chain 135c may output the transmission enable signal EOUT. The transmission enable signal EOUT is delayed by td with respect to the transmission-start signal E. The transmission-start signal E may be activated when the fourth control signal A4 is activated. The control signal delay chain 135d may output the data clock signal CLKOUT. The data clock signal CLKOUT is delayed by td with respect to the clock signal CLK. As shown in FIG. 12B, the data duration of the data stream DOUT is (t1b+td) when the activation interval between two consecutive control signals is t1b. Thus, the difference between the data duration and the activation interval is identical to td that corresponds to the propagation delay of the switching element of delay chain unit 120.

Figure 13:
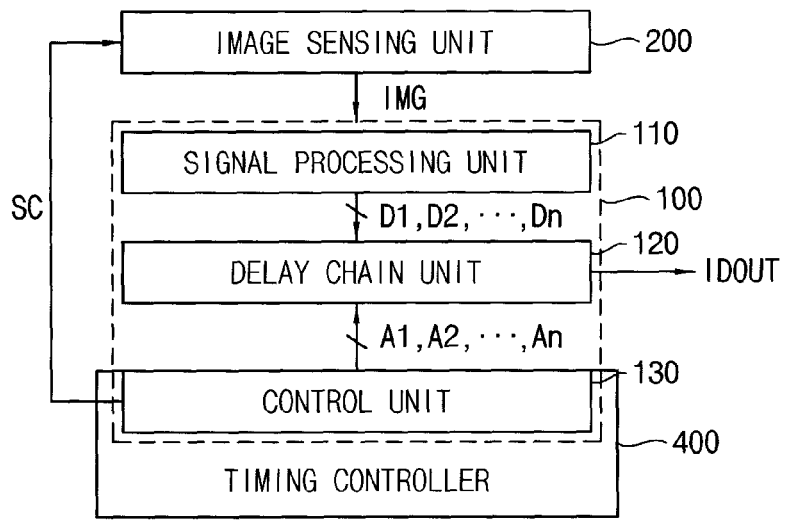
FIGS. 13, 14 and 15 are block diagrams illustrating image sensor systems according to exemplary embodiments.
Figure 14:
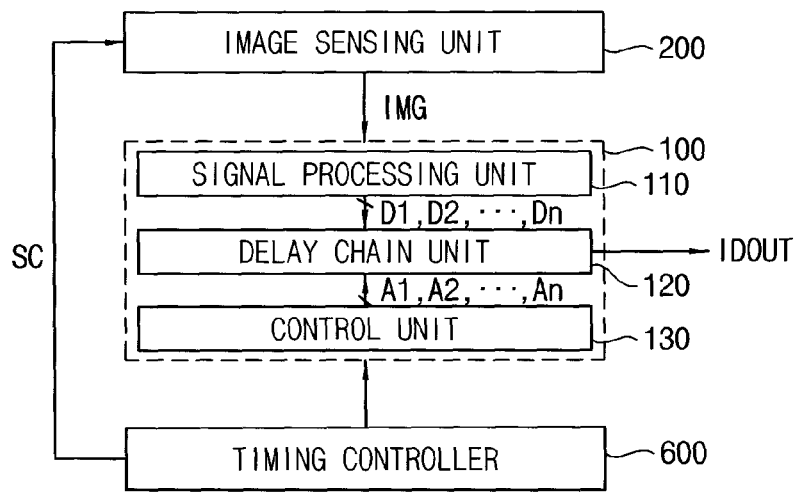
Figure 15:
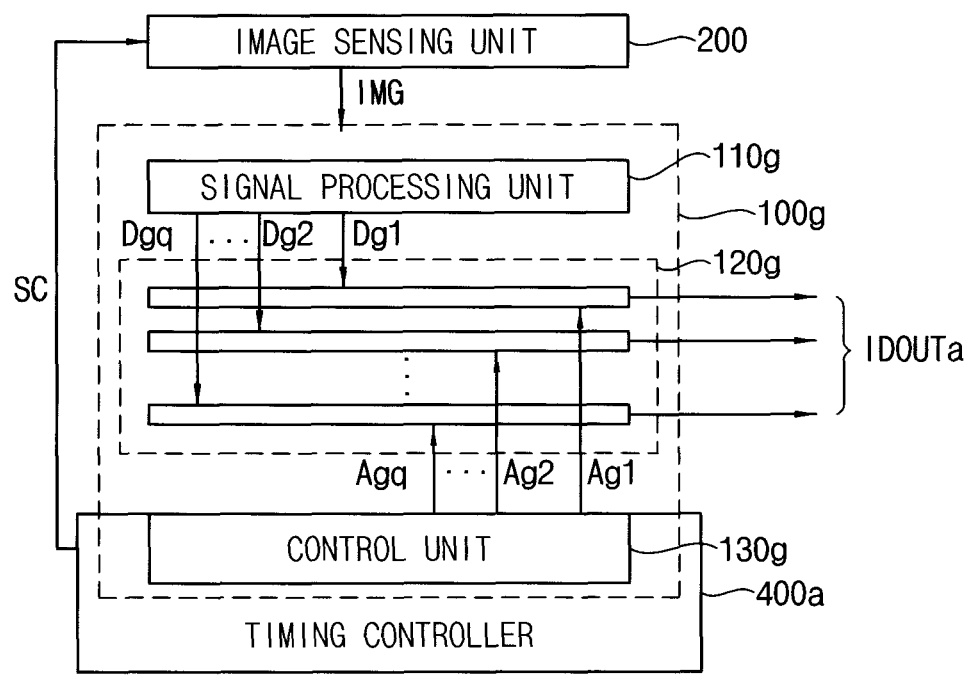

FIGS. 13, 14 and 15 are block diagrams illustrating image sensor systems according to exemplary embodiments of the present inventive concept.

Referring to FIG. 13, an image sensor system 1000 includes a timing controller 400, an image sensing unit 200, a signal processing unit 110 and a delay chain unit 120. The timing controller 400 includes a control unit 130. In this configuration, a data transmission device 100 may be defined to include the signal processing unit 110, the delay chain unit 120 and the control unit 130.

The timing controller 400 outputs a sensor control signal SC and a first control signal A1 through an nth control signal An (n being a natural number). The image sensing unit 200 generates an image signal IMG in response to the sensor control signal SC using at least one of image sensor array. The image sensing unit 200 may include a charge coupled device (CCD) type image sensor or a complementary metal-oxide semiconductor (CMOS) type image sensor.

The signal processing unit 110 generates a first data signal D1 to an nth data signal Dn based upon the image signal IMG. For example, the signal processing unit 110 may perform analog-to-digital conversion on the image signal IMG and may generate the data signals D1, D2, . . . , Dn each of which is a one-bit signal.

The delay chain unit 120 includes a first switching element to an nth switching element that receive the first data signal D1 through the nth data signal Dn, respectively. The delay chain unit 120 may receive the data signals D1, D2, . . . , Dn. The delay chain unit 120 performs pipelining operations on the data signals D1, D2, . . . , Dn based upon the first control signal A1 through the nth control signal An, respectively, to output the pipelined data signals as at least one data stream IDOUT. The switching elements are connected to each other to form at least one data delay chain transmitting the at least one data stream IDOUT. As described with reference to FIG. 1, the control signals A1, A2, . . . , An may be provided by the control unit 130 of the timing controller 400. The delay chain unit 120 may output the pipelined data signals without performing amplifying operation on the pipelined signals. In the conventional data transmission device, the amplifying operation may be performed by amplifiers such as sense amplifiers used in a low-voltage signaling method.

The data transmission device 100 of FIG. 13 is similar to the data transmission system 100 of FIG. 1, and thus a repeated description will be omitted.

Referring to FIG. 14, an image sensor system 3000 includes a timing controller 600, an image sensing unit 200 and a data transmission device 100. The data transmission device includes a signal processing unit 110, a delay chain unit 120 and a control unit 130.

The timing controller 600 controls the operation of the data transmission device 100. The timing controller 600 may provide a clock signal CLK (see FIG. 10) or a transmission-start signal E (see FIG. 8) to the control unit 130. In an exemplary embodiment, the timing controller 600 may provide a composite control signal to the control unit 130, which is decoded into the control signals A1, A2, . . . , An by the control unit 130.

As described with reference to FIGS. 13 and 14, the control unit 130 may be located in the data transmission device 100 or in the timing controller 400. Although the signal processing unit 110 is illustrated to be located outside of image sensor unit 200, the signal processing unit 110 may be implemented in the image sensor unit 200.

According to the control signals A1, A2, . . . , An, the data transmission device 100 may provide the whole of the data signals D1, D2, . . . , Dn or a partial portion of the data signals D1, D2, . . . , Dn. For example, the data transmission device 100 may output a portion of each of the data signals D1, D2, . . . , Dn. In this case, the data transmission device 100 may output the portion by decimating the data signals in time or by selecting a portion of sub-data signals of the data signal when each of the data signals includes sub-data signals as described with reference to FIG. 2C. For example, where the image sensors 1000, 3000 include high dimensional image sensors, the data transmission device 100 may output data signals corresponding to a portion of the image signal IMG as the data stream IDOUT by decimating or down-quantizing the data signals D1, D2, . . . , Dn. The term "down-quantizing" indicates that the number of bits corresponding to a pixel signal of the image signal IMG is decreased based upon the control signals A1, A2, . . . , An. When the data transmission device 100 decimates the data signals, a portion of the control signals A1, A2, . . . , An may not be activated during data transmission.

In exemplary embodiments, as described above, the transmission device 100 may provide the data signals D1, D2, . . . , Dn in a predetermined order which may be determined by controlling the control signals A1, A2, . . . , An.

Referring to FIG. 15, an image sensor system 1000a includes a timing controller 400a, an image sensing unit 200, a signal processing unit 110g and a delay chain unit 120g. The timing controller 400a includes a control unit 130a. In this configuration, a data transmission device 100g may be defined to include the signal processing unit 110g, the delay chain unit 120g and the control unit 130g.

The delay chain unit 120g may include a first delay chain through a qth delay chain (q being a natural number). The plurality of the delay chains may output a plurality of data streams IDOUTa. Each of the delay chains may perform pipelining operations on a group of data signals based upon a group of control signals. For example, the first delay chain may perform pipelining operations on a first group of data signals Dg1 based upon a first group of control signals Ag1. Similarly, the qth delay chain may perform pipelining operations on a first group of data signals Dgq based upon a qth group of control signals Agq.

The signal processing unit 110g may generate the plurality of groups of the data signals Dg1, Dg2, . . . , Dgq which are to be transmitted in parallel as the plurality of data streams IDOUTa. The data signals converted based upon the image signal IMG may be divided into the groups according to a transmission order of the data signals. For example, where q is equal to n of FIG. 2C, the groups Dg1, Dg2, . . . , Dgq may include the first data signal D1c, D2c, . . . , Dnc of FIG. 2C, respectively. As in an exemplary embodiment, the first group Dg1 may include D1c, D(q+1)c, D(2q+1)c, etc. and the jth group Dgj (j being a natural number equal to or smaller than q) may include Djc, D(q+j)c, D(2q+j)c, etc.

The control unit 130g may provide the plurality of groups of the control signals Ag1, Ag2, . . . , Agq to the plurality of data chains, respectively. The control signals may be divided into the groups according to a transmission order of the data signals.

The image sensor system 1000a may generate and efficiently transmit the image signal IMG using the plurality of the delay chains of the delay chain unit 120g because an increase in the number of the delay chain leads to an increase of the capacity of the data transmission. The capacity of the data transmission indicates the amount of data signals transmitted per unit time.

The image sensor system 1000a is similar to the image sensor system 1000 except that the delay chain unit 120g includes the plurality of delay chains, and thus a repeated description will be omitted.

Figure 16:
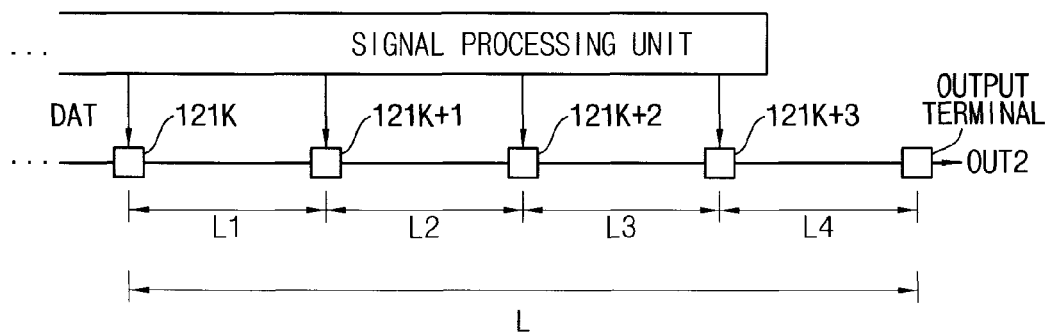
FIG. 16 is a diagram illustrating an exemplary arrangement of switching elements on a transmission line.

FIG. 16 is a diagram illustrating an exemplary arrangement of switching elements on a transmission line.

In FIG. 16, an exemplary embodiment of a delay chain containing four switching elements 121K, 121K+1, 121K+2, 121K+3 that are connected in series to each other may form a transmission path for a data signal DAT. The first switching element 121K and the second switching element 121K+1 may be connected with a distance of L1. The second switching element 121K+1 and the third switching element 121K+2 may be connected with a distance of L2. The third switching element 121K+2 and the fourth switching element 121K+3 may be connected with a distance of L3. The fourth switching element 121K+3 and an output terminal may be connected with a distance of L4. In an exemplary embodiment, the distances L1, L2, L3, L4 are substantially the same. A distance L indicates entire distance of the transmission path for the data signal DAT.

Figure 17:
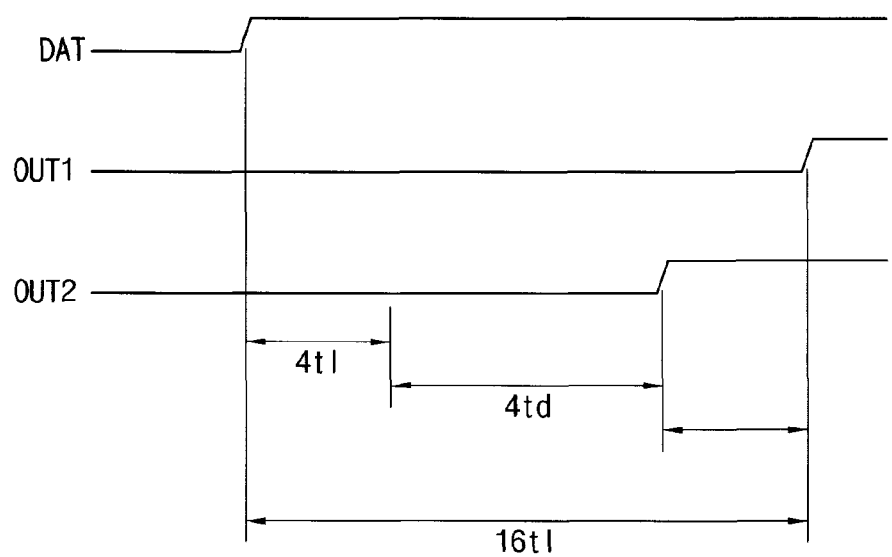
FIG. 17 is a diagram for explaining effect of the exemplary arrangement of FIG. 16.

FIG. 17 is a diagram for explaining the effect of the exemplary arrangement of FIG. 16. In FIG. 17, DAT represents a data signal which is to be transmitted through the delay chain illustrated in FIG. 16. As described above, the data signal DAT represents a data signal which is to be transmitted through such transmission path of FIG. 16. A first output signal OUT1 represents an example of an output signal that is transmitted according to a conventional data transmission device. A second output signal OUT2 represents an example of an output signal that is transmitted according to described exemplary embodiments including such a configuration illustrated in FIG. 16.

In general, the performance of signal transmission depends on various factors such as resistance, parasitic capacitance of transmission wires, etc. When long wires having relatively high surface resistance are employed by CMOS circuits to transmit data signals, transmission propagation effect may be relatively more affected by transmission delays that are caused the resistance and the capacitance of the long wires than other factors. The long wire can be modeled to have a resistance region and a capacitance region. The resistance and capacitance regions are continuously distributed along with the transmission wires, and thus the propagation delay cause by resistance and the capacitance (RC) of the long wires may be approximately calculated using [Equation 1].

$$\text{Delay} = \frac{r \cdot c \cdot l^2}{2} \qquad \text{[Equation 1]}$$

In [Equation 1], r represents resistance of a long wire per unit length, c represent capacitance of the long wire per unit length and l represents the length of the long wire.

Hereinafter, the effect of the described exemplary embodiments will be described with reference to FIGS. 16 and 17. For convenience of explanation, in an exemplary embodiment the lengths L1, L2, L3, L4 are assumed to be the same length.

When the data signal DAT is transmitted through a conventional data transmission device which does not include switching elements on the transmission line and employs the low-voltage transmission method that requires current mode drivers and sense amplifiers, the first output signal OUT1 is output with a first propagation delay of 16 tl that is calculated using [Equation 1]. The first propagation delay of 16 tl represents RC delay of the transmission line and thus is proportional to the square of the length of L. In contrast, the RC delay of the delay chain illustrated in FIG. 16 is a reduced delay of 4 tl because the switching elements 121K, 121K+1, 121K+2, 121K+3 are dividing the transmission line into four sub-wires L1, L2, L3, L4. Substantial transmission delay of the delay chain illustrated in FIG. 16 may be calculated taking into consideration both the RC delay and the propagation delays of the switching elements 121K, 121K+1, 121K+2, 121K+3. Thus, the substantial transmission delay of the second output signal OUT2 is determined to be (4 tl+4 td), where td represent a propagation delay of each of the switching elements 121K, 121K+1, 121K+2, 121K+3. Accordingly, the transmission delay of the second output signal OUT2 may be relatively reduced as compared that of the first output signal OUT1.

The reduction of the transmission delay may be increased when the length L of the transmission wire and/or the number of switching elements are increased. For example, when the switching elements are multiplexers using a 0.13 um semiconductor manufacturing process, the propagation delay thereof is generally a few tens of pico second. However, the reduction may be restricted according to the propagation delays of the switching elements.

Recently, regarding image sensors, the number of pixels and bits allocated to one pixel has been increased and the length of transmission lines to transmit the bits of the pixel has been increased. As described above, the described exemplary embodiments may be efficiently employed to image sensors capable of generating high resolution images and operating high speed transmission.

In addition to the above described effect of the exemplary embodiments, the transmission devices according to described exemplary embodiments may have relatively reduced power consumption. In the conventional transmission devices adopting the low-voltage signal transmission method such as low-voltage differential signaling (LVDS), sense amplifiers and current mode drivers consistently consume power regardless of whether data signals to be transmitted are toggled or not. In contrast, the transmission devices according to the exemplary embodiments consume power when data signals to be transmitted are toggled or the switching elements are toggled between the activation mode and the deactivation mode.

The power consumption of the data transmission device according to exemplary embodiments depends upon current consumption. The current consumption according to the worst case, in which the data stream DOUT transmitted through the delay chain 120 is transitioned between the activation level (e.g., digital '1') and the deactivation level (e.g., digital '0') for every bit, can be calculated using [Equation 2].

$$I_{avgmax} = \left(\frac{ra \cdot Qunit}{2}\right) \cdot \left(\frac{n+1}{2 \cdot t1b}\right) \qquad \text{[Equation 2]}$$

In [Equation 2], $I_{avgmax}$ represents the average current according to the worst case, Qunit represents the amount of charges required to charge an output terminal of the multiplexer to the activation level, ra represents a ratio of consumed current such as short current, n represents the number of the switching elements and t1b represent the data duration time of the data stream DOUT. Quint can be approximately calculated by performing multiplication on the capacitance of wire connected to the output terminal of the multiplexer and a voltage level corresponding to the activation level.

When n is about 1600, the current consumption of a conventional data transmission device referred to as RS1FX may transmit data stream of '0101'-like pattern at a data transmission rate of about 100 Mbps. In this case, the conventional transmission device consumes about 2.1 mA of current per pair of transmission lines, where the sense amplifiers consumes about 2.0 mA and the current mode drivers consumes 0.1 mA, and, thus, current consumption per unit data transmission rate is about 21 uA/Mbps. In contrast, the data transmission device according to exemplary embodiments may transmit the data stream of '0101'-like pattern at a data transmission rate of about 500 Mbps under the same condition of the conventional case. In this case, the data transmission device consumes about 1.5 mA of current per a delay chain such as illustrated in FIG. 16, and, thus, current consumption per unit data transmission rate is about 3 uA/Mbps. The above arithmetic values and corresponding effects are described only for convenience of explanation, and thus the inventive concept may not be limited thereof.

Accordingly, the data transmission devices and the image sensor systems according to the exemplary embodiments may reduce the amount of current consumption or power consumption by eliminating the sense amplifiers and the current mode drivers. Moreover, data transmission devices and the image sensor systems according to the exemplary embodiments may improve the transmission rate by reducing the RC delays of transmission wires.

As described above, the data transmission devices and the image sensor systems according to exemplary embodiments may be employed in various semiconductor circuits, CMOS circuits, etc. Moreover, the data transmission devices and the image sensor systems according to exemplary embodiments may be more effectively used in a image sensor, a handheld electronic device, a memory device, a microprocessor, a personal digital assistant (PDA), a smart phone, a cellular phone, a laptop computer, an image capturing device, a digital camera, a camcorder, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A data transmission device comprising:
    a control unit configured to output a first control signal through an nth control signal, where n is a natural number; and
    a delay chain unit including a first switching element through an nth switching element that receive a first data signal through an nth data signal, respectively, and that perform pipelining operations on the first data signal through nth data signal based upon the first control signal through nth control signal, respectively, to output pipelined data signals as at least one data stream, the first switching element through nth switching element being connected to each other to form at least one data delay chain,
    wherein the control unit sequentially activates the control signals so that the data signals are sequentially outputted as the at least one data stream in response to the sequentially activated control signals, and
    wherein an interval between activation timings of two control signals corresponding to two adjacent switching elements is longer than a propagation delay of each switching element.

2. The data transmission device of claim 1, wherein the switching elements are uniformly arranged to have a predetermined distance between every two adjacent switching elements.

3. The data transmission device of claim 1, wherein each of the switching elements includes:
    a first multiplexer configured to perform a first multiplexing operation on a corresponding data signal to output a multiplexed data signal; and
    a second multiplexer configured to perform a second multiplexing operation on the multiplexed data signal and an output signal of a previous switching element connected to the switching element.

4. The data transmission device of claim 1,
    wherein each of the data signals includes a plurality of sub-data signals, and
    wherein each of the switching elements selectively outputs one of the sub-data signals in response to a corresponding control signal of the control signals.

5. The data transmission device of claim 1,
    wherein the control unit includes:
        a control signal generating block configured to generate a first switching activation signal through an nth switching activation signal; and
        a control signal delaying block configured to delay the switching activation signals to output the delayed switching activation, signals as the control signals.

6. The data transmission device of claim 5, wherein the control signal delaying block includes a first delay element through an nth delay element having substantially the same propagation delays as the first switching element through the nth switching element, respectively.

7. The data transmission device of claim 1, wherein the control unit includes:
    a control signal generating block configured to generate the first control signal to the nth control signal; and
    a control signal delay chain configured to generate a data enable signal including information on transmission timings of the data signals.

8. The data transmission device of claim 7, wherein the data enable signal includes a data clock signal including information on transition timings of the respective data signals and a transmission enable signal including information on a transmission-start timing of the data signals.

9. The data transmission device of claim 8, wherein the control signal delay chain includes a first delay element through an nth delay element having substantially the same propagation delays as the first switching element through the nth switching element, respectively.

10. The data transmission device of claim 1,
    wherein the switching elements are connected in series to each other to form a single data delay chain, and
    wherein the nth switching element outputs the pipelined data signals as a single data stream through the single data delay chain.

11. The data transmission device of claim 10, wherein the first switching element performs a logical operation on the first data signal and the first control signal to output an operated signal to the second switching element.

* * * * *